(12) United States Patent
Miyaoka et al.

(10) Patent No.: US 11,119,964 B2
(45) Date of Patent: Sep. 14, 2021

(54) COMMUNICATION DEVICE AND CONTROL METHOD

(71) Applicant: SONY SEMICONDUCTOR SOLUTIONS CORPORATION, Kanagawa (JP)

(72) Inventors: Hirosada Miyaoka, Kanagawa (JP); Shigenori Uchida, Kanagawa (JP); Katsuhisa Ito, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 6 days.

(21) Appl. No.: 15/580,511

(22) PCT Filed: Jun. 2, 2016

(86) PCT No.: PCT/JP2016/066419
§ 371 (c)(1),
(2) Date: Dec. 7, 2017

(87) PCT Pub. No.: WO2016/203973
PCT Pub. Date: Dec. 22, 2016

(65) Prior Publication Data
US 2018/0143931 A1    May 24, 2018

(30) Foreign Application Priority Data

Jun. 15, 2015  (JP) .............................. JP2015-119952

(51) Int. Cl.
*G06F 13/40* (2006.01)
*G06F 13/38* (2006.01)
*H03H 5/00* (2006.01)

(52) U.S. Cl.
CPC .......... *G06F 13/4027* (2013.01); *G06F 13/38* (2013.01); *G06F 13/4081* (2013.01); *H03H 5/003* (2013.01); *Y02D 10/00* (2018.01)

(58) Field of Classification Search
None
See application file for complete search history.

(56) References Cited

U.S. PATENT DOCUMENTS

| 6,912,651 B1 | 6/2005 | Hamdi et al. |
| 8,971,423 B1 * | 3/2015 | Fu ............................ H04K 1/10 |
| | | 327/20 |

(Continued)

FOREIGN PATENT DOCUMENTS

| JP | 2003-186584 | 4/2003 |
| JP | 2011-508298 | 3/2011 |
| JP | 2015-507243 | 3/2015 |

OTHER PUBLICATIONS

International Search Report prepared by the Japan Patent Office dated Aug. 3, 2016, for International Application No. PCT/JP2016/066419.

(Continued)

*Primary Examiner* — Henry Tsai
*Assistant Examiner* — Christopher A Bartels
(74) *Attorney, Agent, or Firm* — Sheridan Ross P.C.

(57) ABSTRACT

The present technology relates to a communication device and a control method, in which the variety of connection modes between electronic apparatuses can be increased. Provided are: a detection target mechanism detected when the first electronic apparatus is connected to a second electronic apparatus that receives a baseband signal output from the first electronic apparatus; a connection detecting unit adapted to detect a baseband signal output from the second electronic apparatus and to detect a connection between the first and second electronic apparatuses; and a control unit adapted to connect the detection target mechanism to the first electronic apparatus where a connection between the first electronic apparatus and the second electronic apparatus is detected by the connection detecting unit.

(Continued)

The present technology is applicable to, for example, a scenario in which a universal serial bus (USB) host recognizes connection to a USB device.

5 Claims, 22 Drawing Sheets

(56) References Cited

U.S. PATENT DOCUMENTS

| | | | |
|---|---|---|---|
| 9,374,642 B2* | 6/2016 | Jing | H04R 5/04 |
| 9,378,110 B2* | 6/2016 | Miyaoka | H04B 3/52 |
| 2003/0070103 A1 | 4/2003 | Kim | |
| 2003/0140274 A1* | 7/2003 | Neumiller | H04L 1/22 |
| | | | 714/24 |
| 2009/0290582 A1* | 11/2009 | Suenaga | H04L 25/14 |
| | | | 370/389 |
| 2010/0144333 A1* | 6/2010 | Kiasaleh | H04B 1/0003 |
| | | | 455/418 |
| 2010/0280995 A1* | 11/2010 | Munegowda | G06F 11/1435 |
| | | | 707/648 |
| 2011/0273197 A1* | 11/2011 | Banerjee | G01R 31/2843 |
| | | | 324/750.3 |
| 2011/0273309 A1* | 11/2011 | Zhang | A61B 5/7465 |
| | | | 340/870.07 |
| 2011/0291875 A1* | 12/2011 | Szajnowski | G01S 13/34 |
| | | | 342/70 |
| 2012/0055239 A1* | 3/2012 | Sinha | G01F 1/74 |
| | | | 73/61.79 |
| 2012/0191400 A1* | 7/2012 | Sontakke | G01R 31/31724 |
| | | | 702/119 |
| 2013/0009470 A1* | 1/2013 | Chuang | H02J 7/0065 |
| | | | 307/31 |
| 2013/0010849 A1* | 1/2013 | Shimizu | H04L 5/06 |
| | | | 375/219 |
| 2014/0016034 A1* | 1/2014 | Cirstea | H04N 7/108 |
| | | | 348/460 |
| 2014/0273833 A1* | 9/2014 | McCormack | H04B 5/0037 |
| | | | 455/41.1 |
| 2015/0058642 A1* | 2/2015 | Okamoto | G06F 13/14 |
| | | | 713/300 |
| 2015/0234421 A1* | 8/2015 | Jung | G06F 1/08 |
| | | | 713/401 |
| 2015/0288410 A1* | 10/2015 | Adiletta | H04L 49/10 |
| | | | 455/73 |
| 2016/0019174 A1* | 1/2016 | Sreenath | G06F 13/287 |
| | | | 375/219 |
| 2016/0116509 A1* | 4/2016 | Kim | G01R 31/045 |
| | | | 361/86 |
| 2016/0127671 A1* | 5/2016 | Hundal | G06F 13/4247 |
| | | | 348/723 |
| 2016/0216757 A1* | 7/2016 | Kim | G06F 13/287 |
| 2016/0378971 A1* | 12/2016 | Dunstan | G06F 21/44 |
| | | | 726/17 |
| 2017/0115344 A1* | 4/2017 | Kuehnis | G01R 31/31715 |
| 2017/0229925 A1* | 8/2017 | Shirani-Mehr | H04W 76/30 |
| 2018/0074173 A1* | 3/2018 | Trotta | G01S 13/584 |
| 2018/0189224 A1* | 7/2018 | Vadivelu | G06F 13/4022 |
| 2018/0225230 A1* | 8/2018 | Litichever | G06F 21/82 |
| 2018/0227159 A1* | 8/2018 | Rakib | H04L 27/2646 |
| 2019/0104549 A1* | 4/2019 | Deng | H04B 7/0617 |
| 2020/0386854 A1* | 12/2020 | Melzer | G01S 13/584 |

OTHER PUBLICATIONS

Official Action (with English translation) for Chinese Patent Application No. 201680033184.9, dated Jul, 20, 2020. 11 pages.

* cited by examiner

COMMUNICATION DEVICE AND CONTROL METHOD

CROSS REFERENCE TO RELATED APPLICATIONS

This application is a national stage application under 35 U.S.C. 371 and claims the benefit of PCT Application No. PCT/JP2016/066419 having an international filing date of 2 Jun. 2016, which designated the United States, which PCT application claimed the benefit of Japanese Patent Application No. 2015-119952 filed 15 Jun. 2015, the disclosures of which are incorporated herein by reference in their entirety.

TECHNICAL FIELD

The present technology relates to a communication device and a control method, and particularly relates to a communication device and a control method which can increase variety of a connection mode between electronic apparatuses such as a USB host and a USB device compliant with the universal serial bus (USB) standard.

BACKGROUND ART

Exemplary electronic apparatuses compliant with the USB standard include (an electronic apparatus serving as) a USB host and (an electronic apparatus serving as) a USB device.

The USB host and the USB device are connected by using, for example, a USB cable, and the USB host takes initiative to control communication between the USB host and the USB device.

The USB standard supports a bus power(ed) mode, and not only a signal (data) but also a power source can be supplied to the USB device from the USB host by the USB cable.

However, an upper limit of current that can be supplied as a power source by one USB cable is specified in the USB standard. Therefore, there is proposed technology in which a power source is supplied from a USB host to a USB device having consumption current exceeding the upper limit specified in the USB standard (refer to, for example, Patent Document 1).

CITATION LIST

Patent Document

Patent Document 1: Japanese Patent Application Laid-Open No. 2012-008716

SUMMARY OF THE INVENTION

Problems to be Solved by the Invention

Incidentally, variety of a connection mode of connection between electronic apparatuses is demanded to be increased.

The present technology is made in view of such a situation, and intended to increase the variety of a connection mode between electronic apparatuses.

Solutions to Problems

A communication device according to an aspect of the present technology includes: a detection target mechanism detected by a first electronic apparatus when the first electronic apparatus is connected to a second electronic apparatus that receives a baseband signal output from the first electronic apparatus, and corresponding to a mechanism incorporated in the second electronic apparatus, the detection target mechanism being adapted to be connected to the first electronic apparatus; a connection detecting unit adapted to detect a baseband signal output from the second electronic apparatus and adapted to detect connection between the first electronic apparatus and the second electronic apparatus; and a control unit adapted to connect the detection target mechanism to the first electronic apparatus in a case where connection between the first electronic apparatus and the second electronic apparatus is detected by the connection detecting unit.

The control unit can disconnect the detection target mechanism from the first electronic apparatus in a case where the baseband signal is not detected by the connection detecting unit for a predetermined period.

The detection target mechanism can be formed of common mode impedance.

It is possible to further include a transmission unit adapted to transmit a millimeter wave band signal obtained by applying frequency conversion to a baseband signal output from the first electronic apparatus into a signal having a frequency band higher than that of the baseband signal.

A control method according to an aspect of the present technology is a control method for a communication device including a detection target mechanism detected by a first electronic apparatus when the first electronic apparatus is connected to a second electronic apparatus that receives a baseband signal output from the first electronic apparatus, and corresponding to a mechanism incorporated in the second electronic apparatus, the detection target mechanism being adapted to be connected to the first electronic apparatus, and the method includes: detecting a baseband signal output from the second electronic apparatus, and detecting connection between the first electronic apparatus and the second electronic apparatus; and connecting the detection target mechanism to the first electronic apparatus in a case where connection between the first electronic apparatus and the second electronic apparatus is detected.

According to the communication device and the control method according to an aspect of the present technology, provided is the detection target mechanism detected by the first electronic apparatus when the first electronic apparatus is connected to the second electronic apparatus that receives a baseband signal output from the first electronic apparatus, and corresponding to a mechanism incorporated in the second electronic apparatus, the detection target mechanism being adapted to be connected to the first electronic apparatus. In a case where a baseband signal output from the second electronic apparatus is detected, connection between the first electronic apparatus and the second electronic apparatus is detected, and connection between the first electronic apparatus and the second electronic apparatus is detected, the detection target mechanism is connected to the first electronic apparatus.

Note that the communication device may be an independent device or may be an internal block constituting one device.

Effects of the Invention

According to the present technology, the variety of a mode of a connection between electronic apparatuses can be increased.

Note that effects recited herein are not necessarily limited thereto and may be any one of those recited in the present disclosure.

MODE FOR CARRYING OUT THE INVENTION

<Communication System Having Electronic Apparatuses Connected by Electric Cable>

Figure 1:
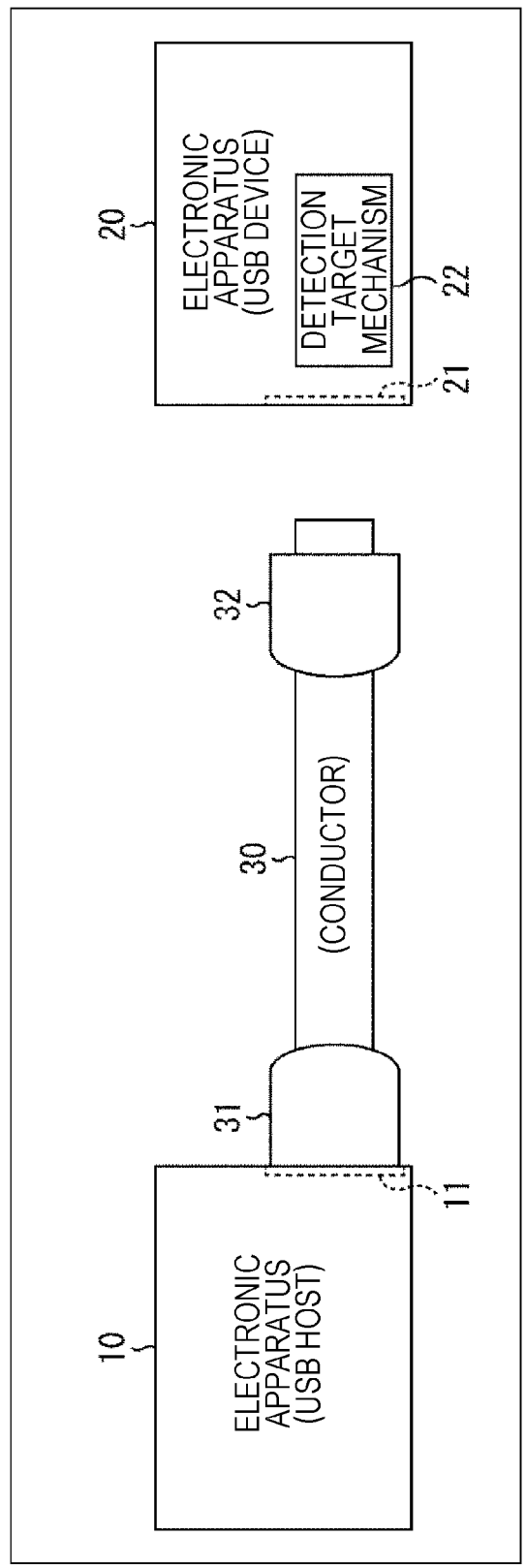
FIG. 1 is a diagram illustrating an exemplary configuration of a communication system in which electronic apparatuses are connected to each other by an electric cable.

FIG. 1 is a diagram illustrating an exemplary configuration of a communication system in which electronic apparatuses are connected to each other by an electric cable.

In the communication system of FIG. 1, an electronic apparatus 10 and an electronic apparatus 20 are connected by an electric cable 30.

The electronic apparatus 10 includes a connector 11 that can be connected to a connector 31 of the electric cable 30, and can exchange (input and output) a baseband signal of a baseband with another apparatus such as the electronic apparatus 20 via the connector 11.

The electronic apparatus 20 includes a connector 21 that can be connected to a connector 32 of the electric cable 30, and can exchange (input and output) a baseband signal of a baseband with another apparatus such as the electronic apparatus 10 via the connector 21.

Additionally, the electronic apparatus 20 incorporates a detection target mechanism 22 to be detected by the electronic apparatus 10 when the electronic apparatus 10 is connected to the electronic apparatus 20 adapted to receive a baseband signal output from the electronic apparatus 10.

The electric cable 30 is a cable including, as a core wire (line to connect the connectors 31 and 32), a conductor (hereinafter also referred to as a baseband conductor) used to transmit an electric signal as a baseband signal, has one end provided with the connector 31 to be connected to the electronic apparatus 10, and has the other end provided with the connector 32 to be connected to the electronic apparatus 20.

In the communication system having the above-described configuration, when the electronic apparatuses 10 and 20 are connected by using the electric cable 30, in other words, when the connector 11 of the electronic apparatus 10 and the connector 31 of the electric cable 30 are connected and also the connector 21 of the electronic apparatus 20 and the connector 32 of the electric cable 30 are connected, the detection target mechanism 22 incorporated in the electronic apparatus 20 is detected by the electronic apparatus 10 via the electric cable 30, and connection to the electronic apparatus 20 is recognized by detection of this detection target mechanism 22.

As described above, a method of detecting (recognizing) connection between electronic apparatuses by detecting the detection target mechanism 22 is adopted in, for example, the USB (USB 3.0) standard and the like.

In the following, the present technology will be described assuming that the electronic apparatus 10 and the electronic apparatus 20 are, for example, electronic apparatuses compliant with the USB standard.

In a case where the electronic apparatus 10 and the electronic apparatus 20 are the electronic apparatuses compliant with the USB standard, the electronic apparatuses 10 and 20 and the electric cable 30 are, respectively, a USB host, a USB device, and a USB cable, and will be also referred to as the USB host 10, the USB device 20, and the USB cable 30 in the following.

Additionally, in the case where the electronic apparatus 10 and the electronic apparatus 20 are the electronic apparatuses compliant with the USB standard, the connector 11 of the electronic apparatus 10 and the connector 21 of the electronic apparatus 20 are USB connectors (sockets) (receptacles), and the connectors 11 and 21 will be also referred to as the USB connectors 11 and 21 respectively in the following.

Furthermore, in the case where the electronic apparatus 10 and the electronic apparatus 20 are the electronic apparatuses compliant with the USB standard, the connectors 31 and 32 of the USB cable 30 are USB connectors (plugs), and the connectors 31 and 32 will be also referred to as USB connectors 31 and 32 respectively in the following.

The USB host 10 is an electronic apparatus, such as a personal computer (PC) or a digital camera, adapted to be operated by individually receiving power supply from an external power source (independently from bus power) or by receiving power supply from a battery built inside, and at least having a function to serve as a USB host.

As for the USB host 10, the USB connectors 11 and 31 are connected (coupled) by inserting the USB connector 31 of the USB cable 20 into the USB connector 11 of the USB host 10.

The USB device 20 is an electronic apparatus, such as a disk drive, adapted to be operated by receiving power supply of bus power or by receiving power supply from an external power source or power supply from a battery built inside, and at least having a function to serve as a USB device.

As for the USB device 20, the USB connectors 21 and 32 are connected by inserting the USB connector 32 of the USB cable 20 into the USB connector 21 included in the USB device 20.

The USB cable 30 is a cable compliant with the USB standard, has one end provided with the USB connector 31 to be connected to the USB host 10, and has the other end provided with a USB connector 32 to be connected to the USB device 20. The core wire of the USB cable 30 is formed of a baseband conductor such as copper.

In the communication system having the above-described configuration, when the USB host 10 and the USB device 20 are connected by using the USB cable 30, the detection target mechanism 22 incorporated in the USB device 20 is detected by the USB host 10 via the USB cable 30, and connection to the USB device 20 is recognized by detecting this detection target mechanism 22.

The detection target mechanism 22 incorporated in the USB device 20 is formed by a resistance serving as common mode impedance adopted in the USB 3.0 standard or the USB 3.1 standard, for example.

When the USB host 10 and the USB device 20 are connected, the common mode impedance serving as the detection target mechanism 22 incorporated in the USB device 20 is (electrically) connected to the USB host 10, and as a result, impedance at the time of viewing the USB connector 11 side from (the inside of) the USB host 10 is changed between a case where the USB host 10 and the USB device 20 are not connected and a case where the USB host 10 and the USB device 20 are connected.

In the USB host 10, connection of the USB device 20 is recognized (detected) on the basis of a fact that the impedance at the time of viewing the USB connector 11 side from the USB host 10 has become impedance in a case where the common mode impedance serving as the detection target mechanism 22 is connected to the USB host 10.

Meanwhile, in the USB host 10, detection of the impedance at the time of viewing the USB connector 11 side from the USB host 10, namely, detection of the common mode impedance serving as the detection target mechanism 22 is equivalently performed by detecting a time constant of voltage at the time of viewing the USB connector 11 side from the USB host 10 (change rate of voltage at the time of viewing the USB connector 11 side from the USB host 10).

Figure 2:
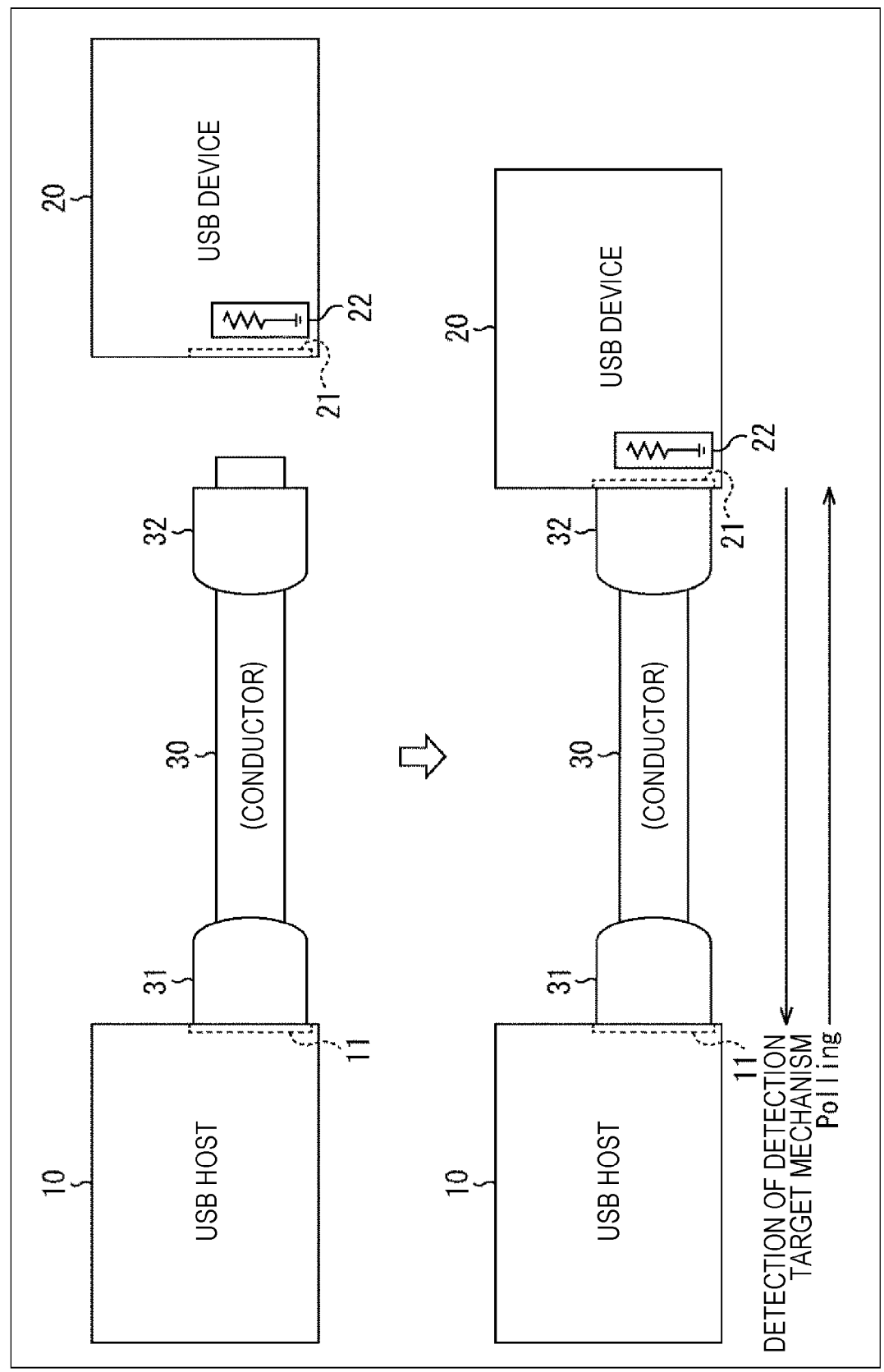
FIG. 2 is a diagram to describe exemplary operation of the communication system.

FIG. 2 is a diagram illustrating exemplary operation of the communication system in FIG. 1.

In a case where the USB host 10 and the USB device 20 are not connected, the detection target mechanism 22 incorporated in the USB device 20 is not connected to the USB host 10, and therefore, the detection target mechanism 22 cannot be detected by the USB host 10.

When the USB host 10 and the USB device 20 are connected via the USB cable 30, the detection target mechanism 22 incorporated in the USB device 20 is connected to the USB host 10 via the USB cable 30, and the detection target mechanism 22 is detected by the USB host 10.

Upon detection of the detection target mechanism 22, the USB host 10 recognizes (detects) connection to the USB device 20, shifts to a polling state to perform polling, and starts outputting a baseband signal from the USB connector 11 as the polling.

Then, when the USB device 20 responds to the polling from the USB host 10, the USB host 10 and the USB device 20 is brought into a state capable of performing communication (exchange of baseband signals).

<Communication System Adapted to Perform Data Transmission by Millimeter Wave Band Modulation Signal>

Figure 3:
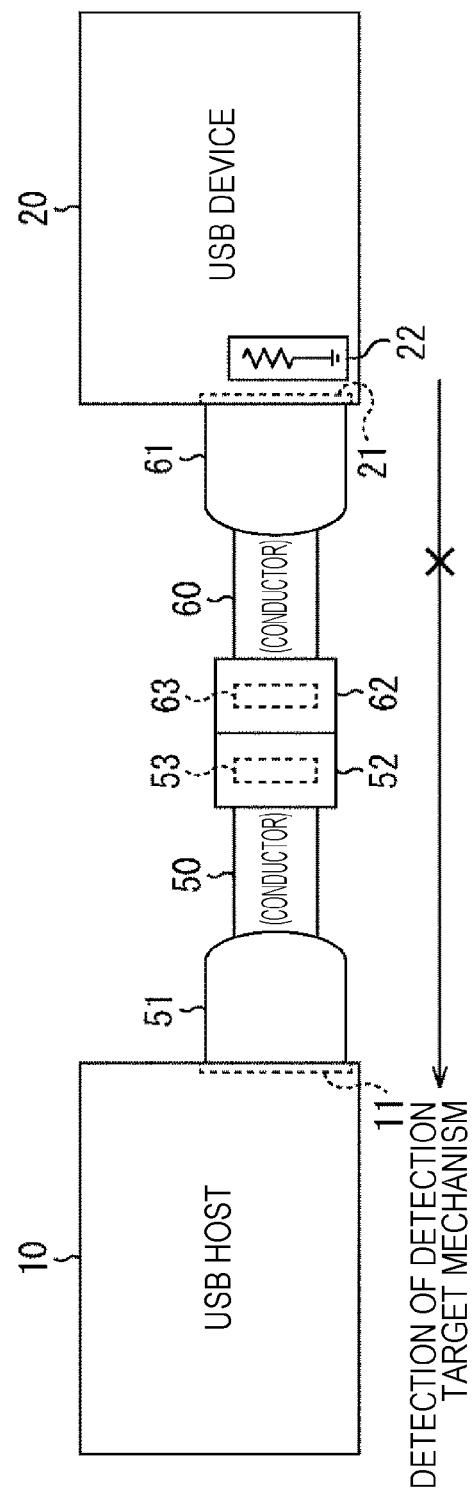
FIG. 3 is a diagram illustrating an exemplary configuration of a communication system adapted to perform data transmission by a millimeter wave band modulation signal.

FIG. 3 is a diagram illustrating an exemplary configuration of a communication system adapted to perform data transmission by using a millimeter wave band modulation signal.

Note that, in the drawing, a component corresponding to a component in the case of FIG. 1 is denoted by a same reference sign, and a description therefor will be suitably omitted in the following.

The communication system in FIG. 3 is common with the case of FIG. 1 in including the USB host 10 and the USB device 20.

However, the communication system in FIG. 3 is different from the case of FIG. 1 in that millimeter wave cables 50 and 60 are provided instead of the USB cable 30.

Here, a millimeter wave band (modulation) signal is a signal having a frequency of about 30 to 300 GHz, namely, a wavelength of about 1 to 10 mm. According to the millimeter wave band signal, data transmission can be performed at a high data rate because of having a high frequency, and communication can be performed while using various waveguides as transmission paths. In other words, according to the millimeter wave band signal, communication (radio communication) can be performed by using, for example, a small antenna while using a free space as a transmission path. Furthermore, according to the millimeter wave band signal, communication can be performed while using a metallic wire or a dielectric material such as plastic as a transmission path.

The millimeter wave cable 50 is a cable having one end provided with a USB connector 51 to be connected to the USB host 10, and having the other end provided with a millimeter wave connector 52 to be fitted to a millimeter wave connector 62. In the millimeter wave cable 50, a baseband conductor is adopted as the core wire to connect the USB connector 51 to (a communication unit 53 of) the millimeter wave connector 52, similar to the USB cable 30.

The millimeter wave connector 52 is formed of a material such as a dielectric material serving as a waveguide adapted to transmit a millimeter wave band modulation signal (radio frequency (RF) signal), and incorporates the communication unit 53 adapted to perform communication with a millimeter wave band modulation signal.

The communication unit 53 applies frequency conversion to differential signals into a millimeter wave band modulation signal, and transmits the modulation signal (to a communication unit 63) via the millimeter wave connectors 52 and 62 serving as the waveguides, in which the differential signals are baseband signals supplied from the USB host 10 via non-illustrated data transmission terminals of the USB connector 51 (for example, + and − terminals of a signal transmission line for the USB 3.0 in a case of the USB 3.0 standard).

Furthermore, the communication unit 53 receives the millimeter wave band modulation signal transmitted (from the communication unit 63) via the millimeter wave connectors 52 and 62 serving as the waveguides, applies frequency conversion to the millimeter wave band modulation signal into baseband signals, and supplies the baseband signals to the USB host 10 via non-illustrated data transmission terminals of the USB connector 51 (for example, + and − terminals of a signal reception line for the USB 3.0 in a case of the USB 3.0).

The millimeter wave cable 60 is formed in a manner similar to the millimeter wave cable 50.

In other words, the millimeter wave cable 60 has one end provided with a USB connector 61 to be connected to the USB device 20, and has the other end provided with a millimeter wave connector 62 to be fitted to the millimeter wave connector 52. In the millimeter wave cable 60, a baseband conductor is adopted as a core wire adapted to connect the USB connector 61 to (the communication unit 63 of) the millimeter wave connector 62 in a manner similar to the USB cable 30.

The millimeter wave connector 62 is formed of a material such as a dielectric material serving as a waveguide adapted to transmit a millimeter wave band modulation signal, and incorporates the communication unit 63 adapted to perform communication with a millimeter wave band modulation signal.

The communication unit 63 applies frequency conversion to a differential signal into a millimeter wave band modulation signal, and transmits the modulation signal (to the communication unit 53) via the millimeter wave connectors 62 and 52 serving as the waveguides, in which the differential signal is a baseband signal supplied from the USB device 20 via a non-illustrated data transmission terminal of the USB connector 61.

Furthermore, the communication unit 63 receives the millimeter wave band modulation signal transmitted (from the communication unit 53) via the millimeter wave connectors 52 and 62 serving as the waveguides, applies frequency conversion to the baseband signal, and supplies the baseband signal to the USB device 20 via a non-illustrated data transmission terminal of the USB connector 61.

Note that, as a length of each of the millimeter wave cables 50 and 60, for example, about 10 cm to 1 m can be adopted.

In the communication system in FIG. 3 having the above-described configuration, when the USB connectors 11 and 51, the millimeter wave connectors 52 and 62, and the USB connectors 21 and 61 are respectively connected, data transmission can be performed between the USB host 10 and the USB device 20 via the millimeter wave cables 50 and 60.

In other words, a baseband signal as data to be transmitted by the USB host 10 is transmitted after applied with frequency conversion into a millimeter wave band modulation signal in the communication unit 53.

The modulation signal transmitted by the communication unit 53 is received in the communication unit 63, and applied with frequency conversion into a baseband signal, and then supplied to the USB device 20.

On the other hand, the baseband signal as data to be transmitted by the USB device 20 is transmitted being applied with frequency conversion into a millimeter wave band modulation signal in the communication unit 63.

The modulation signal transmitted by the communication unit 63 is received in the communication unit 53, and applied with frequency conversion into a baseband signal, and then supplied to the USB host 10.

As described above, in the communication system of FIG. 3, the USB host 10 and the USB device 20 serving as the electronic apparatuses are connected not by the USB cable 30 but by the millimeter wave cables 50 and 60, and data transmission between the USB host 10 and the USB device 20 is performed via a millimeter wave band modulation signal, and therefore, variety of a connection mode between the electronic apparatuses can be increased.

Here, in the communication system of FIG. 3, the millimeter wave connectors 52 and 62 incorporating the communication units 53 and 63 adapted to transmit and receive millimeter wave band modulation signals are formed of a dielectric material such as plastic or another non-metal.

Therefore, according to the millimeter wave connectors 52 and 62, it is easier to handle water proofing and dust proofing compared to a connector formed of a metal, and it is not necessary to consider deterioration of a contact point caused by insertion/removal, and furthermore, freedom of design can be increased.

Meanwhile, the millimeter wave connectors 52 and 62 can be formed of a metal instead of the non-metal.

In addition, in FIG. 3, the communication unit 53 is incorporated in the millimeter wave connector 52, but besides, the communication unit 53 can also be incorporated in, for example, the USB connector 51.

In a case where the communication unit 53 is incorporated in the USB connector 51, a space between the USB connector 51 and the millimeter wave connector 52 of the millimeter wave cable 50 is needed to be formed not as a baseband conductor but as a waveguide serving as a millimeter wave transmission path (for example, formed as a transmission path to guide a millimeter wave by a dielectric material or the like having a different dielectric constant).

Similarly, the communication unit 63 can also be incorporated not in the millimeter wave connector 62 but in the USB connector 61. In a case where the communication unit 63 is incorporated in the USB connector 61, a space between the USB connector 61 and the millimeter wave connector 62 of the millimeter wave cable 60 is needed to be formed as a waveguide serving as a millimeter wave transmission path.

<Exemplary Configurations of Communication Units 53 and 63>

Figure 4:
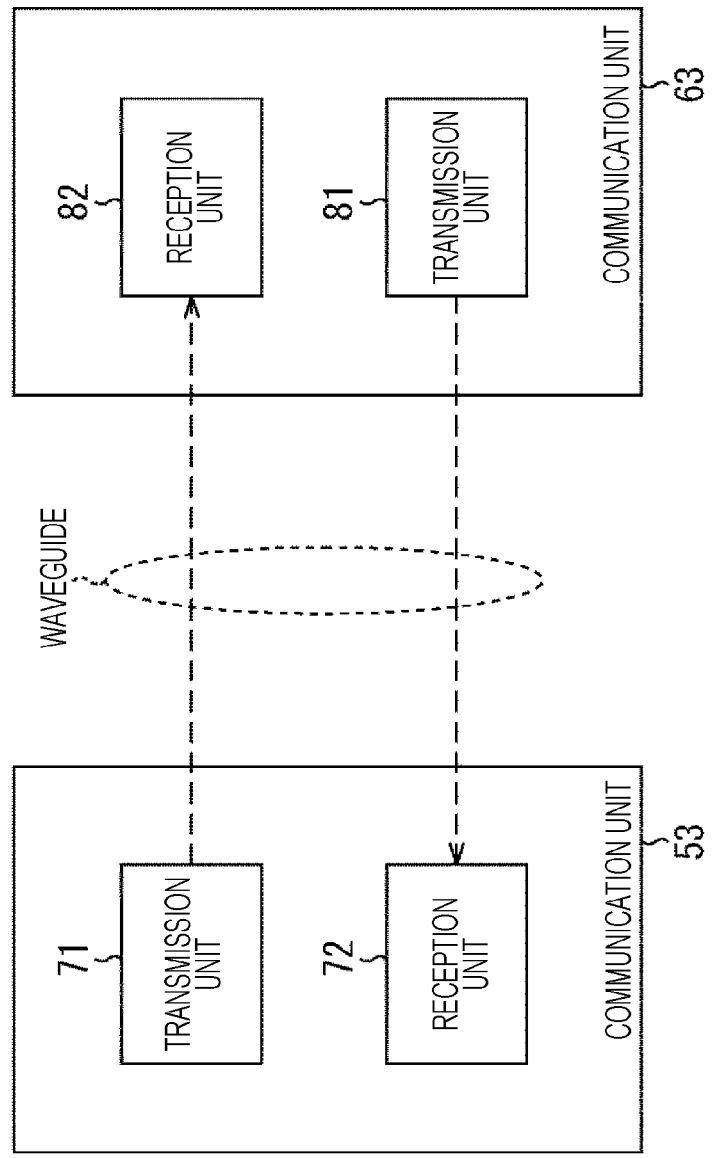
FIG. 4 is a block diagram illustrating exemplary configurations of communication units 53 and 63.

FIG. 4 is a block diagram illustrating exemplary configurations of the communication units 53 and 63 in FIG. 3.

The communication unit 53 includes a transmission unit 71 and a reception unit 72.

The transmission unit 71 transmits a signal (data) in a carrier wave communication system in which, for example, a millimeter wave band signal is used as a carrier. In other words, the transmission unit 71 applies frequency conversion to a baseband signal (supplied from the USB host 10) into a millimeter wave band modulation signal, and transmits the millimeter wave band modulation signal (to a reception unit 82) via the millimeter wave connectors 52 and 62 (FIG. 3) serving as the waveguides.

The reception unit 72 receives the millimeter wave band modulation signal transmitted (from a transmission unit 81) by the carrier wave communication system via the millimeter wave connectors 62 and 52 serving as the waveguides, and applies frequency conversion to the millimeter wave band modulation signal into a baseband signal, and then outputs the baseband signal (to the USB host 10).

The communication unit 63 includes the transmission unit 81 and the reception unit 82.

For example, the transmission unit 81 transmits a signal by the carrier wave communication system in which a millimeter wave signal of a frequency band same as that of the transmission unit 71 or a frequency band different from that of the transmission unit 71 is used as a carrier. In other words, the transmission unit 81 applies frequency conversion to the baseband signal (supplied from the USB device 20) into a millimeter wave band modulation signal, and transmits the millimeter wave band modulation signal (to the reception unit 72) via the millimeter wave connectors 62 and 52 serving as the waveguides.

The reception unit 82 receives the millimeter wave band modulation signal transmitted (from the transmission unit 71) by the carrier wave communication system via the millimeter wave connectors 52 and 62 serving as the waveguides, and applies frequency conversion to the millimeter wave band modulation signal into a baseband signal, and outputs the baseband signal (to the USB device 20).

As described above, since the communication unit 53 includes the transmission unit 71 and the reception unit 72 and the communication unit 63 includes the transmission unit 81 and the reception unit 82, bidirectional communication can be performed between the communication units 53 and 63.

Note that in a case of using millimeter wave signals of the same frequency band as carriers in the transmission units 71 and 81, half-duplex communication can be performed between the communication units 53 and 63. However, even in a case of using the millimeter wave signals of the same frequency band as the carriers in the transmission units 71 and 81, full duplex communication can be performed by having isolation between the transmission units 71 and 81 Furthermore, in a case of using millimeter wave signals of different frequency bands as carriers in the transmission units 71 and 81, full duplex communication can be performed between the communication units 53 and 63.

<Exemplary Configurations of Transmission Unit 71, Reception Unit 72, Transmission Unit 81, and Reception Unit 82>

Figure 5:
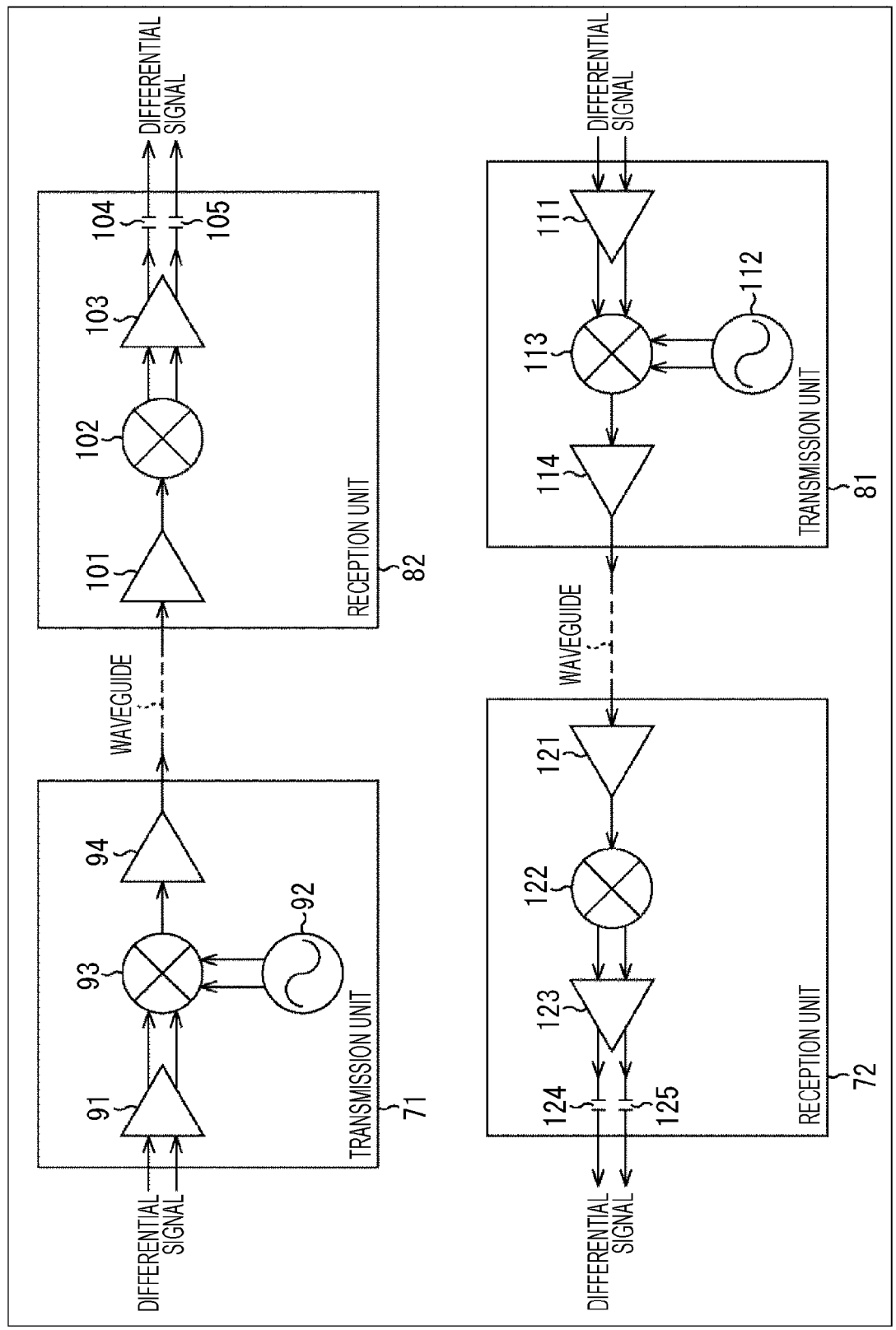
FIG. 5 is a diagram illustrating exemplary configurations of a transmission unit 71, a reception unit 72, a transmission unit 81, and a reception unit 82.

FIG. 5 is a diagram illustrating exemplary configurations of the transmission unit 71, reception unit 72, transmission unit 81, and the reception unit 82 in FIG. 4.

The transmission unit 71 includes an amplifier 91, an oscillator 92, a mixer 93, and an amplifier 94.

Differential signal corresponding to baseband signals (for example, + and − signals of a signal transmission line for the USB 3.0 in a case of the USB 3.0) are supplied to amplifier 91 from the USB host 10.

The amplifier 91 amplifies the differential signals as necessary and supplies the same to the mixer 93.

The oscillator 92 generates a carrier of the millimeter wave band such as 56 GHz by oscillation, and supplies the carrier to the mixer 93.

Here, according to a carrier of the millimeter wave band such as 56 GHz, it is possible to transmit a differential signal having a data rate of, for example, 11 Gbps at a maximum. For example, since the maximum data rate is 5 Gbps (Giga bit per second) in the USB 3.0, data (differential signals) of the USB 3.0 can be transmitted without a problem by the carrier of the millimeter wave band such as 56 GHz.

The mixer 93 applies frequency conversion to the differential signals by using the carrier from the oscillator 92 by mixing (multiplying) the differential signals from the amplifier 91 with the carrier from the oscillator 92, and supplies the amplifier 94 with a millimeter wave band modulation signal of, for example, amplitude shift keying (ASK) obtained as a result thereof.

The amplifier 94 amplifies the modulation signal from the mixer 93 as necessary, and outputs (transmits) the modulation signal onto (the millimeter wave connector 52 serving as) the waveguide.

The reception unit 82 includes an amplifier 101, a mixer 102, an amplifier 103, and capacitors 104 and 105.

The amplifier 101 receives the millimeter wave band modulation signal transmitted from the transmission unit 71 via (the millimeter wave connectors 52 and 62 serving as) the waveguides, amplifies the modulation signal as necessary, and supplies the same to the mixer 102.

The mixer 102 applies frequency conversion to the millimeter wave band modulation signal from the amplifier 101 into differential signals corresponding to baseband signals by performing square law detection in which the millimeter wave band modulation signals supplied from the amplifier 101 are mixed (modulation signals are squared), and supplies the differential signals to the amplifier 103.

The amplifier 103 amplifies the differential signals from the mixer 102 as necessary and supplies the same to the USB device 20 as differential signals of USB (for example, + and − signals of a signal transmission line for the USB 3.0 in a case of the USB 3.0).

Note that one signal (hereinafter also referred to as a positive signal) out of two (baseband) signals as the differential signals obtained in the amplifier 103 is supplied to the USB device 20 via the capacitor 104, and the other signal (hereinafter also referred to as a negative signal) is supplied to the USB device 20 via the capacitor 105. In the capacitors 104 and 105, direct current components are cut.

Furthermore, it is assumed in FIG. 5 that the reception unit 82 applies frequency conversion to a millimeter wave band modulation signal into baseband signals by the square law detection, but alternatively, the reception unit 82 can apply frequency conversion to a modulation signal into baseband signals by performing detection other than the square law detection, such as synchronized detection in which a carrier is reproduced and the carrier is mixed with the modulation signal.

The transmission unit 81 includes an amplifier 111, an oscillator 112, a mixer 113, and an amplifier 114.

Since the amplifiers 111 to 114 have configurations similar to the amplifiers 91 to 94 of the transmission unit 71, the description therefor will be omitted.

The reception unit 72 includes an amplifier 121, a mixer 122, an amplifier 123, and capacitors 124 and 125.

Since the amplifier 121 to the capacitor 125 have configurations similar to the amplifier 101 to the capacitor 105 of the reception unit 82, the description therefor will be omitted.

In the transmission unit 71, reception unit 72, transmission unit 81, and the reception unit 82 configured as described above, transmission of a baseband signal from the USB host 10 to the USB device 20 is performed by transmitting a millimeter wave band modulation signal from the transmission unit 71 and receiving the modulation signal in the reception unit 82.

Additionally, transmission of the baseband signal from the USB device 20 to the USB host 10 is performed by transmitting a millimeter wave band modulation signal from the transmission unit 81 and receiving the modulation signal in the reception unit 72.

Incidentally, in the communication system of FIG. 3, the USB host 10 and the USB device 20 are connected via the communication units 53 and 63 adapted to exchange millimeter wave band modulation signals. Therefore, even when the USB host 10 and the USB device 20 are connected by using the millimeter wave cables 50 and 60, it is difficult for the USB host 10 to detect the detection target mechanism 22 incorporated in the USB device 20.

Additionally, in a case where the detection target mechanism 22 incorporated in the USB device 20 is not detected by the USB host 10, connection to the USB device 20 is not recognized (detected) and polling is not performed.

As a result, there may be a problem in which data transmission (exchange of baseband signals) is not performed between the USB host 10 and the USB device 20 even when the USB host 10 and the USB device 20 are connected by using the millimeter wave cables 50 and 60.

Therefore, in the present technology, the problem of not being able to perform data transmission is prevented while increasing variety of a connection mode between the electronic apparatuses, namely, between the USB host 10 and the USB device 20.

First Embodiment of Communication System Applying Present Technology

Figure 6:
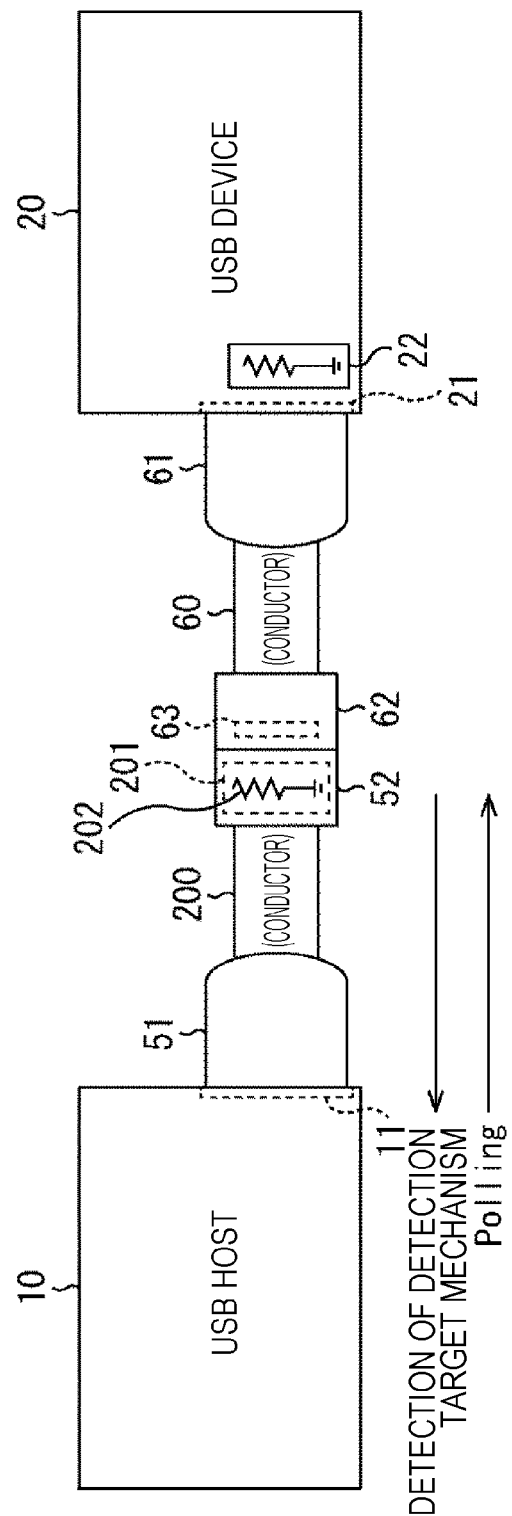
FIG. 6 is a diagram illustrating an exemplary configuration of a first embodiment of a communication system applying the present technology.

FIG. 6 is a diagram illustrating an exemplary configuration of a first embodiment of a communication system applying the present technology.

Note that, in the drawing, a component corresponding to a component in a case of FIG. 3 is denoted by a same reference sign, and a description therefor will be suitably omitted in the following.

The communication system of FIG. 6 is similar to the case of FIG. 3 in including a USB host 10, a USB device 20, and a millimeter wave cable 60.

However, the communication system in FIG. 6 is different from the case of FIG. 3 in that a millimeter wave cable 200 is provided instead of a millimeter wave cable 50.

The millimeter wave cable 200 is common with the millimeter wave cable 50 of FIG. 3 in including a USB connector 51 and a millimeter wave connector 52.

However, the millimeter wave cable 200 is different from the millimeter wave cable 50 of FIG. 3 in that the millimeter wave connector 52 incorporates a communication unit 201 instead of a communication unit 53.

Meanwhile, similar to the case in FIG. 3, the communication unit 201 can be incorporated not in the millimeter wave connector 52 but in the USB connector 51.

Similar to the communication unit 53 in FIG. 3, the communication unit 201 applies frequency conversion to a differential signal, namely, a baseband signal from the USB host 10 into a millimeter wave band modulation signal, transmits the differential signal, also receives a millimeter wave band modulation signal, and applies frequency conversion to the millimeter wave band modulation signal into a baseband signal, and then supplies the baseband signal to the USB host 10.

Furthermore, the communication unit 201 includes a detection target mechanism 202. The detection target mechanism 202 corresponds to a detection target mechanism 22 incorporated in the USB device 20 (mechanism similar to the detection target mechanism 22), and when the USB connector 51 is connected to a USB connector 11 of the USB host 10, the detection target mechanism 202 is (electrically) connected to the USB host 10.

Therefore, in a manner similar to that the USB host 10 detects the detection target mechanism 22 incorporated in the USB device 20 and recognizes connection to the USB device 20 in a case where the USB host 10 is connected to the USB device 20 via a USB cable 30 in FIG. 1, in a case where the millimeter wave cable 200 is connected, the USB host 10 detects the detection target mechanism 202 included in the communication unit 201 and recognizes connection to the USB device 20 (even when the USB device 20 is not actually connected).

As a result, polling is started in the USB host 10, and data transmission (exchange of baseband signals) is performed with the USB device 20 (in a case where the USB device 20 is actually connected).

As described above, according to the communication system in FIG. 6, the problem of not being able to perform data transmission between the USB host 10 and the USB device 20 can be solved.

<Exemplary Configuration of Communication Unit 201>

Figure 7:
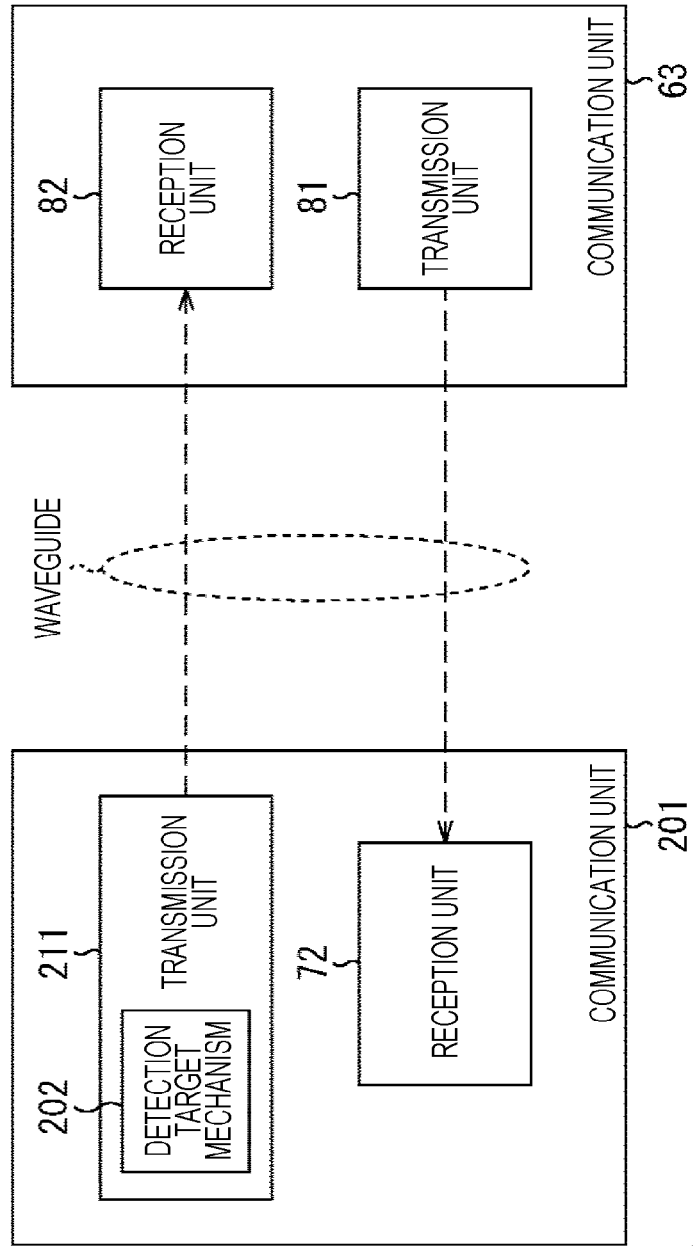
FIG. 7 is a block diagram illustrating an exemplary configuration of a communication unit 201.

FIG. 7 is a block diagram illustrating an exemplary configuration of the communication unit 201 in FIG. 6.

Note that, in the drawing, a component corresponding to a component of the communication unit 53 in FIG. 4 is denoted by a same reference sign, and a description therefor will be suitably omitted in the following.

The communication unit 201 is common with the communication unit 53 of FIG. 4 in including a reception unit 72.

However, the communication unit 201 is different from the communication unit 53 of FIG. 4 in including a transmission unit 211 instead of a transmission unit 71.

Similar to the transmission unit 71 in FIG. 4, the transmission unit 211 applies frequency conversion to a baseband signal (supplied from the USB host 10) into a millimeter wave band modulation signal, and transmits the millimeter wave band modulation signal (to a reception unit 82) via millimeter wave connectors 52 and 62 serving as the waveguides.

Furthermore, the transmission unit 211 includes the detection target mechanism 202. The detection target mechanism 202 is provided on a path through which a baseband signal is supplied from the USB host 10 to the transmission unit 211.

Therefore, when the millimeter wave cable 200 (FIG. 6) (USB connector 51) is connected to (the USB connector 11 of) the USB host 10, the USB host 10 detects the detection target mechanism 202 via the path to supply a baseband signal to the transmission unit 211, and recognizes connection to the USB device 20 (even when the USB device 20 is not actually connected).

Meanwhile, in the communication system of FIG. 6, in a case where a device to detect a detection target mechanism and recognizes connection to a communication partner is used instead of the USB device 20 in a manner similar to the USB host 10, a communication unit having a configuration similar to the communication unit 201 is provided for a communication unit 63 in FIG. 7 instead of the communication unit 63.

<Exemplary Operation of Communication System>

Figure 8:
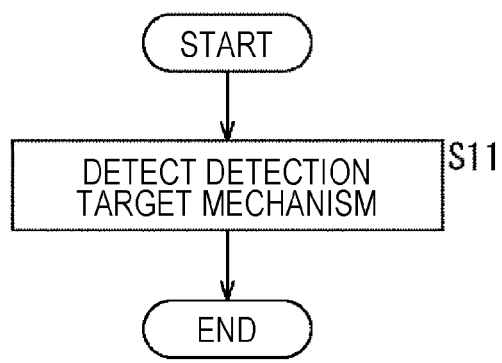
FIG. 8 is a flowchart illustrating exemplary operation of the communication system.

FIG. 8 is a flowchart illustrating exemplary operation of the communication system in FIG. 6.

When the millimeter wave cable 200 (FIG. 6) is connected to the USB host 10, the USB host 10 is connected to the transmission unit 211 via the path to supply a baseband signal to the transmission unit 211, and consequently, the transmission unit 211 causes the USB host 10 to detect the detection target mechanism 202 provided on the path to supply a baseband signal from the USB host 10 to the transmission unit 211 in step S11.

Upon detection of the detection target mechanism 202, the USB host 10 recognizes connection to the USB device 20 and starts polling.

Then, when there is a response to the polling from the USB device 20, the USB host 10 starts data transmission (exchange of baseband signals) with the USB device 20.

<Exemplary Configuration of Transmission Unit 211>

Figure 9:
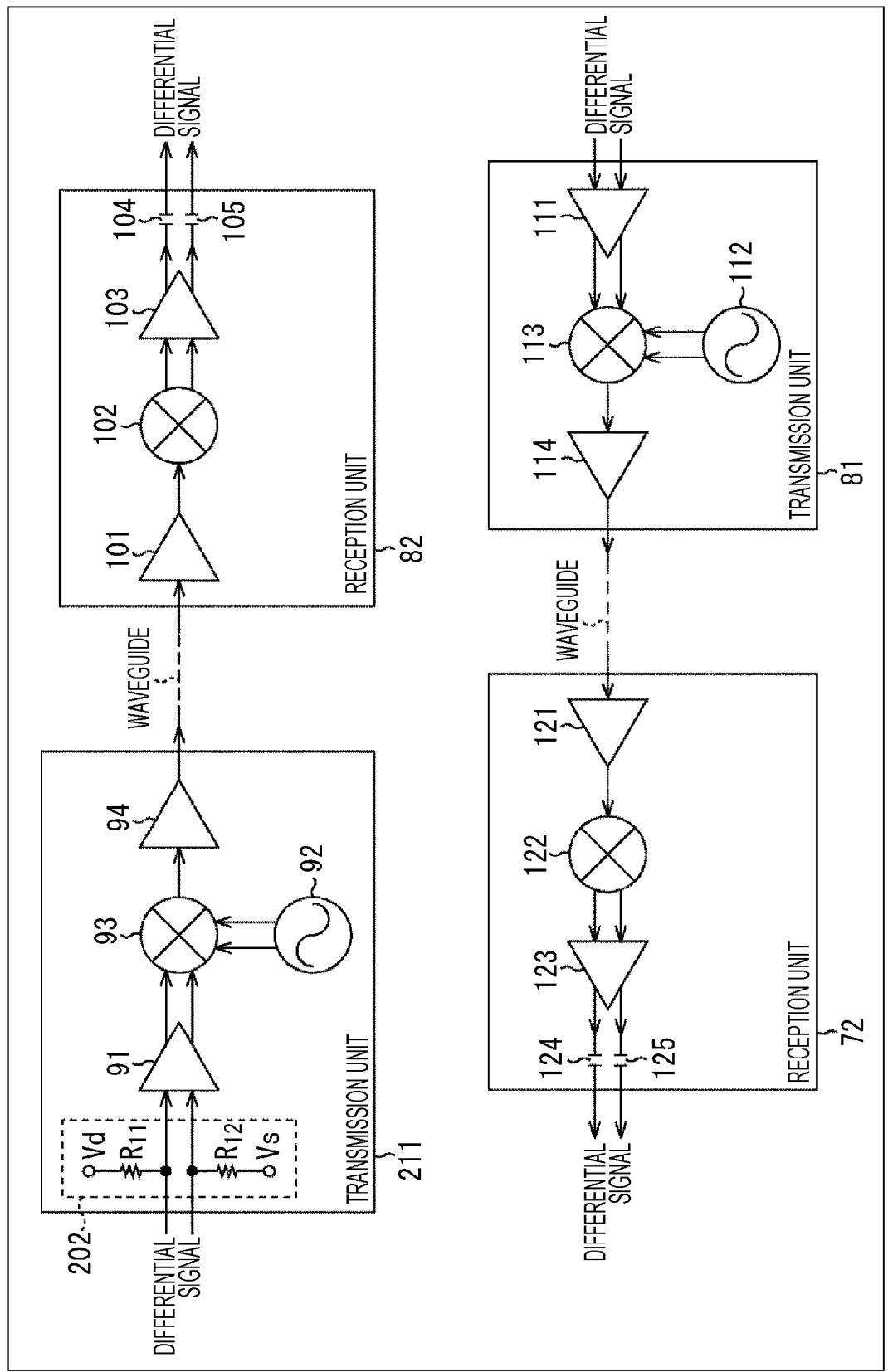
FIG. 9 is a diagram illustrating an exemplary configuration of a transmission unit 211.

FIG. 9 is a diagram illustrating an exemplary configuration of the transmission unit 211.

Note that, in the drawing, a component corresponding to a component of the transmission unit 71 in FIG. 5 is denoted by a same reference sign, and a description therefor will be suitably omitted in the following.

The transmission unit 211 is common with the transmission unit 71 of FIG. 5 in including an amplifier 91, an oscillator 92, a mixer 93, and an amplifier 94.

However, the transmission unit 211 is different from the transmission unit 71 of FIG. 5 in including the detection target mechanism 202.

The detection target mechanism 202 is formed of resistors $R_{11}$ and $R_{12}$ serving as common mode impedance adopted in the USB 3.0 standard and the USB 3.1 standard.

Each of the resistors $R_{11}$ and $R_{12}$ has one end connected to an input terminal of the amplifier 91 to be supplied with differential signals, namely, baseband signals from the USB host 10, and the resistors $R_{11}$ and $R_{12}$ have the other ends respectively connected power sources $V_d$ and $V_s$.

In other words, the resistor $R_{11}$ has the one end connected to an input terminal, out of two input terminals of the amplifier 91, to be supplied with (receive) a positive signal which is one signal of differential signals, and has the other end connected to the power source $V_d$.

The resistor $R_{12}$ has one end connected to an input terminal, out of the two input terminals of the amplifier 91, to be supplied with (receive) a negative signal which is the other signal of the differential signals, and has the other end connected to the power source $V_s$.

Here, the negative signal and the positive signal, which are differential signals, ideally are signals in which an added value of the negative signal and the positive signal becomes zero.

Additionally, the power source $V_d$ is, for example, a power source having voltage +v (>0), and the power source $V_s$ is, for example, a power source having voltage −v.

In the transmission unit 211 having the above-described configuration, when the millimeter wave cable 200 (FIG. 6) is connected to the USB host 10, the USB host 10 detects the resistors $R_{11}$ and $R_{12}$ serving as the common mode impedance constituting the detection target mechanism 202 connected to the input terminals of the amplifier 91.

Consequently, the USB host 10 recognizes connection to the USB device 20 and starts polling.

Then, when there is a response to the polling from the USB device 20, the USB host 10 starts data transmission (exchange of baseband signals) with the USB device 20.

Exchange of baseband signals is performed between the USB host 10 and the USB device 20 as follows.

In other words, baseband signals, namely, differential signals output from the USB host 10 are converted into a millimeter wave band modulation signal in the transmission unit 211 through the amplifier 91, the mixer 93, and the amplifier 94, and the millimeter wave band modulation signal is transmitted to the reception unit 82 via the millimeter wave connectors 52 and 62 serving as the waveguides.

The modulation signal from the transmission unit 211 is received in the reception unit 82, and converted into baseband signals, namely, differential signals through an amplifier 101, a mixer 102, an amplifier 103, and capacitors 104 and 105, and then supplied to the USB device 20.

On the other hand, baseband signals, namely, differential signals output from the USB device 20 are converted into a millimeter wave band modulation signal in the transmission unit 81 through an amplifier 111, a mixer 113, and an amplifier 114, and transmitted to the reception unit 72 via the millimeter wave connectors 62 and 52 serving as the waveguides.

The modulation signal from the transmission unit 81 is received in the reception unit 72, and converted into baseband signals, namely, differential signals through an amplifier 121, a mixer 122, an amplifier 123, and capacitors 124 and 125, and then supplied to the USB host 10.

<Exemplary Operation of USB Host 10>

Figure 10:
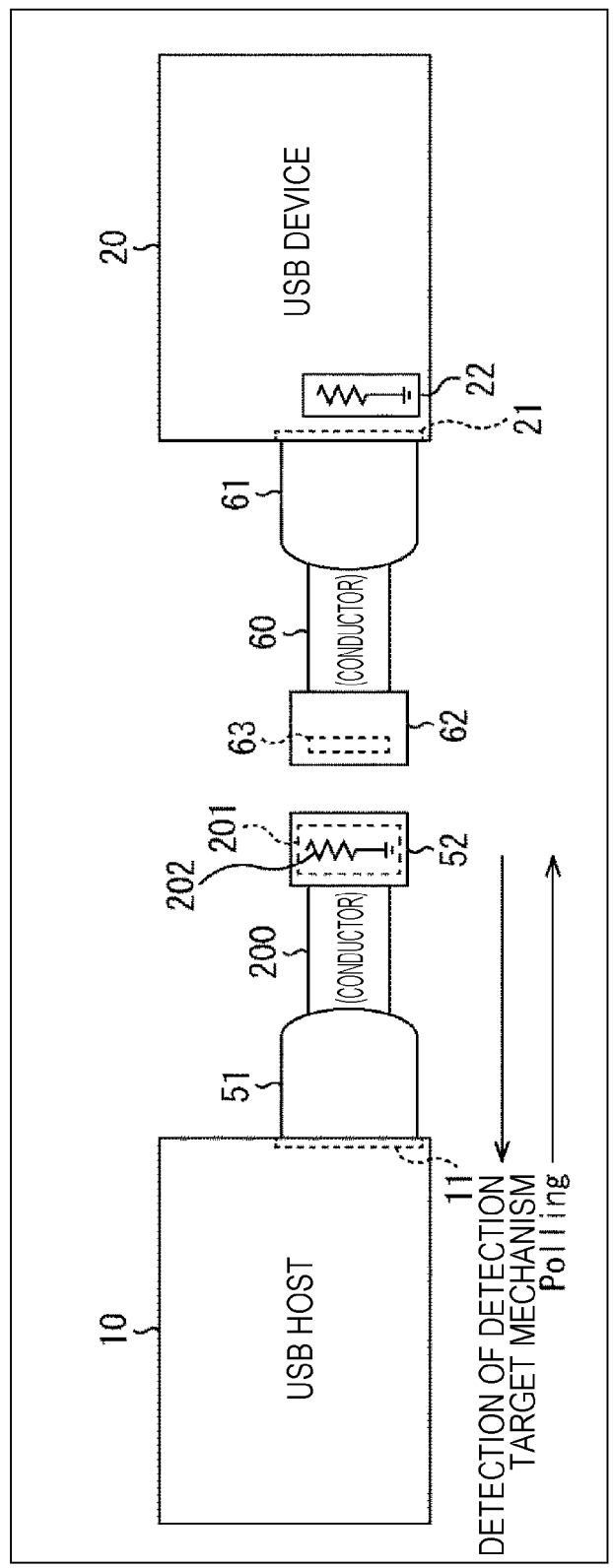
FIG. 10 is a diagram illustrating exemplary operation of a USB host 10 in the communication system.

FIG. 10 is a diagram to describe exemplary operation of the USB host 10 in the communication system of FIG. 6.

As described in FIGS. 6 to 9, when the millimeter wave cable 200 is connected to the USB host 10, the USB host 10 detects the detection target mechanism 202 provided in the millimeter wave connector 52 of the millimeter wave cable 200, thereby recognizing connection to the USB device 20 and starting polling.

Now, in a case where the USB host 10 and the USB device 20 are connected via the millimeter wave cables 200 and 60 as illustrated in FIG. 6, the USB device 20 responds to the polling from the USB host 10, and then data transmission is performed between the USB host 10 and the USB device 20.

Incidentally, for example, in a case where the millimeter wave cable 200 is connected to the USB host 10 even when the millimeter wave connector 52 of the millimeter wave cable 200 and the millimeter wave connector 62 of the millimeter wave cable 60 are not connected as illustrated in FIG. 10, the USB host 10 detects the detection target mechanism 202 of the communication unit 201 provided in the millimeter wave connector 52 of the millimeter wave cable 200, and recognizes connection to the USB device 20 and performs polling as a result thereof.

However, in a case where the millimeter wave connector 52 of the millimeter wave cable 200 and the millimeter wave connector 62 of the millimeter wave cable 60 are not connected (in a case where the millimeter wave connectors 52 and 62 are apart from each other more than a distance in which a millimeter wave band modulation signal can be received at a minimum necessary level), connection between the USB host 10 and the USB device 20 is cut off, and therefore, the USB device 20 does not respond to polling of the USB host 10.

Therefore, the USB host 10 continues (data transmission for) polling and power is consumed wastefully although not connected to the USB device 20 (connection to the USB device 20 is cut off).

Considering this, in the present technology, wasteful power consumption in the USB host 10 as described above is prevented by controlling connection between (for example, common mode impedance serving as) the detection target mechanism and the USB host 10 in accordance with a connection state between the USB host 10 and the USB device 20.

Second Embodiment of Communication System Applying Present Technology

Figure 11:
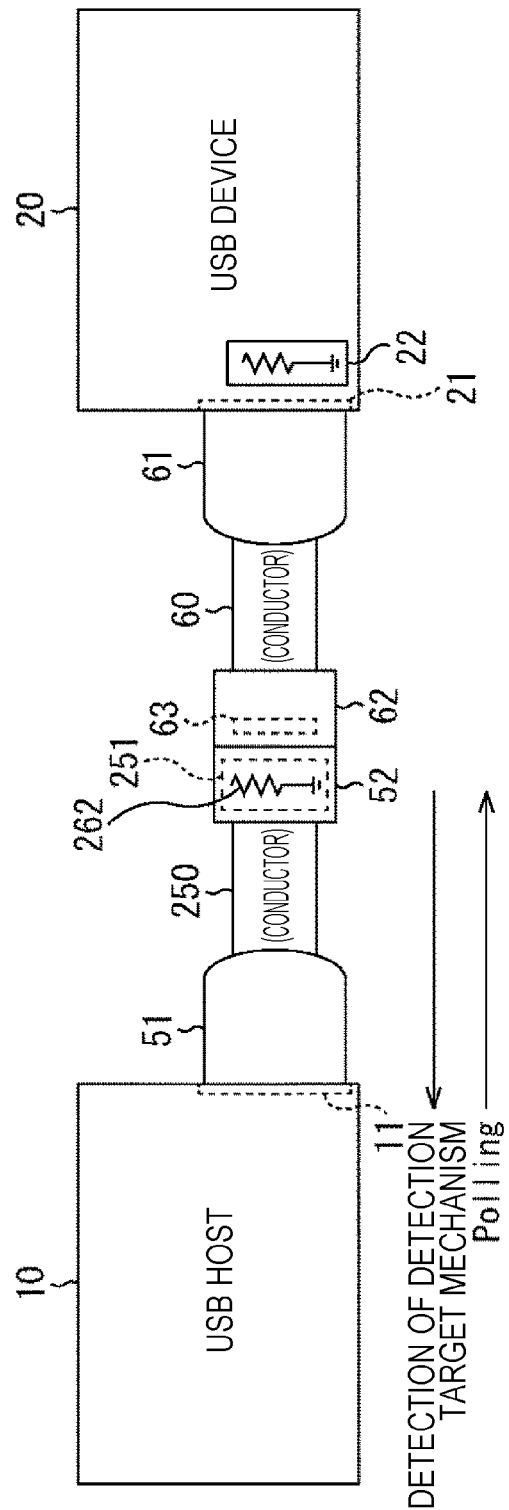
FIG. 11 is a diagram illustrating an exemplary configuration of a second embodiment of a communication system applying the present technology.

FIG. 11 is a diagram illustrating an exemplary configuration of a second embodiment of a communication system applying the present technology.

Note that, in the drawing, a component corresponding to a component in a case of FIG. 6 is denoted by a same reference sign, and a description therefor will be suitably omitted in the following.

The communication system of FIG. 11 is common with the case of FIG. 6 in including a USB host 10, a USB device 20, and a millimeter wave cable 60.

However, the communication system in FIG. 11 is different from the case of FIG. 6 in that a millimeter wave cable 250 is provided instead of a millimeter wave cable 200.

The millimeter wave cable 250 is common with the millimeter wave cable 200 of FIG. 6 in including a USB connector 51 and a millimeter wave connector 52.

However, the millimeter wave cable 250 is different from the millimeter wave cable 200 of FIG. 6 in that the millimeter wave connector 52 incorporates a communication unit 251 instead of a communication unit 201.

Meanwhile, similar to the cases in FIGS. 3 and 6, the communication unit 251 can be incorporated not in the millimeter wave connector 52 but in the USB connector 51.

The communication unit 251 is common with the communication unit 201 in FIG. 6 in applying frequency conversion to a differential signal, namely, a baseband signal from the USB host 10 into a millimeter wave band modulation signal, transmitting the modulation signal, receiving a millimeter wave band modulation signal, applying frequency conversion to the millimeter wave band modulation signal into a baseband signal, and supplying the baseband signal to the USB host 10.

However, the communication unit 251 is different from the communication unit 201 of FIG. 6 in including a detection target mechanism 262 instead of the detection target mechanism 202 (FIGS. 6 and 7).

The detection target mechanism 262 is common with the detection target mechanism 202 in that when the USB connector 51 is connected to a USB connector 11 of the USB host 10, the detection target mechanism 262 is (electrically) connected to the USB host 10, and consequently detected by the USB host 10.

However, the detection target mechanism 262 is different from the detection target mechanism 202 in being configured to be able to control connection to the USB host 10.

<Exemplary Configuration of Communication Unit 251>

Figure 12:
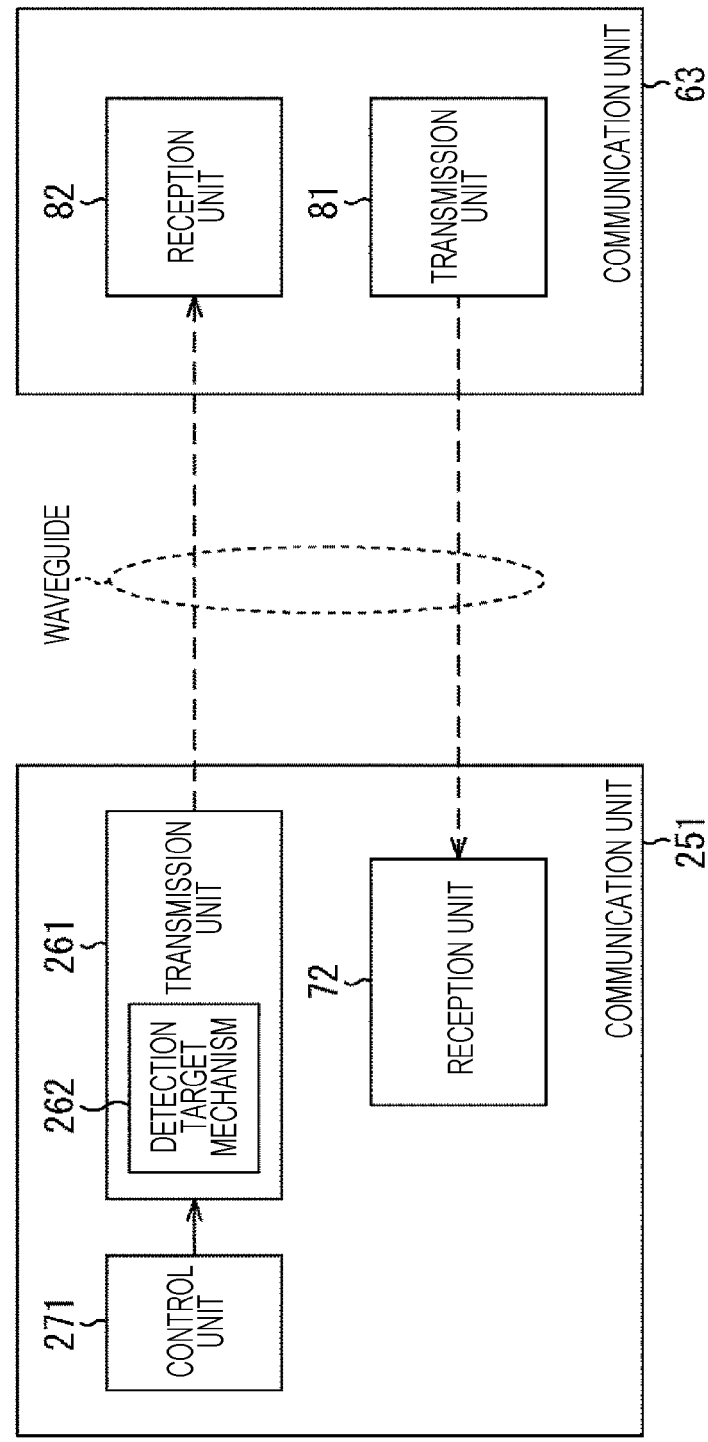
FIG. 12 is a block diagram illustrating an exemplary configuration of a communication unit 251.

FIG. 12 is a block diagram illustrating an exemplary configuration of the communication unit 251 in FIG. 11.

Note that, in the drawing, a component corresponding to a component of the communication unit 201 in FIG. 7 is denoted by a same reference sign, and a description therefor will be suitably omitted in the following.

The communication unit 251 is common with the communication unit 201 of FIG. 7 in including the reception unit 72.

However, the communication unit 251 is different from the communication unit 201 of FIG. 7 in including a transmission unit 261 instead of the transmission unit 211.

Furthermore, the communication unit 251 is also different from the communication unit 201 of FIG. 7 in that a control unit 271 is newly provided.

Similar to the transmission unit 211 in FIG. 7, the transmission unit 261 applies frequency conversion to a baseband signal (supplied from the USB host 10) into a millimeter wave band modulation signal, and transmits the millimeter wave band modulation signal (to the reception unit 82) via the millimeter wave connectors 52 and 62 serving as the waveguides.

Furthermore, the transmission unit 261 includes the detection target mechanism 262. The detection target mechanism 262 is provided on a path through which a baseband signal is supplied from the USB host 10, and is in common with the detection target mechanism 202 of FIG. 7 in this point.

However, as described in FIG. 11, the detection target mechanism 262 is configured to be able to control connection to the USB host 10, and differs from the detection target mechanism 202 in this point.

The control unit 271 controls connection between the detection target mechanism 262 and the USB host 10 in accordance with a connection state between the USB host 10 and the USB device 20.

In other words, the control unit 271 detects connection (state) between the USB host 10 and the USB device 20.

Then, in a case where connection between the USB host 10 and the USB device 20 (a fact that the USB host 10 and the USB device 20 are connected) is detected, the control unit 271 (electrically) connects the detection target mechanism 262 to the USB host 10.

On the other hand, in a case where disconnection of connection between the USB host 10 and the USB device 20 (a fact that the USB host 10 and the USB device 20 are not connected) is detected, the control unit 271 disconnects the detection target mechanism 262 from the USB host 10.

Meanwhile, in the communication system of FIG. 11, in a case where a device to detect a detection target mechanism and recognize connection to a communication partner is used instead of the USB device 20 in a manner similar to the USB host 10, a communication unit having a configuration similar to the communication unit 251 is provided for the communication unit 63 in FIG. 12 instead of the communication unit 63.

<Exemplary Configuration of Control Unit 271>

Figure 13:
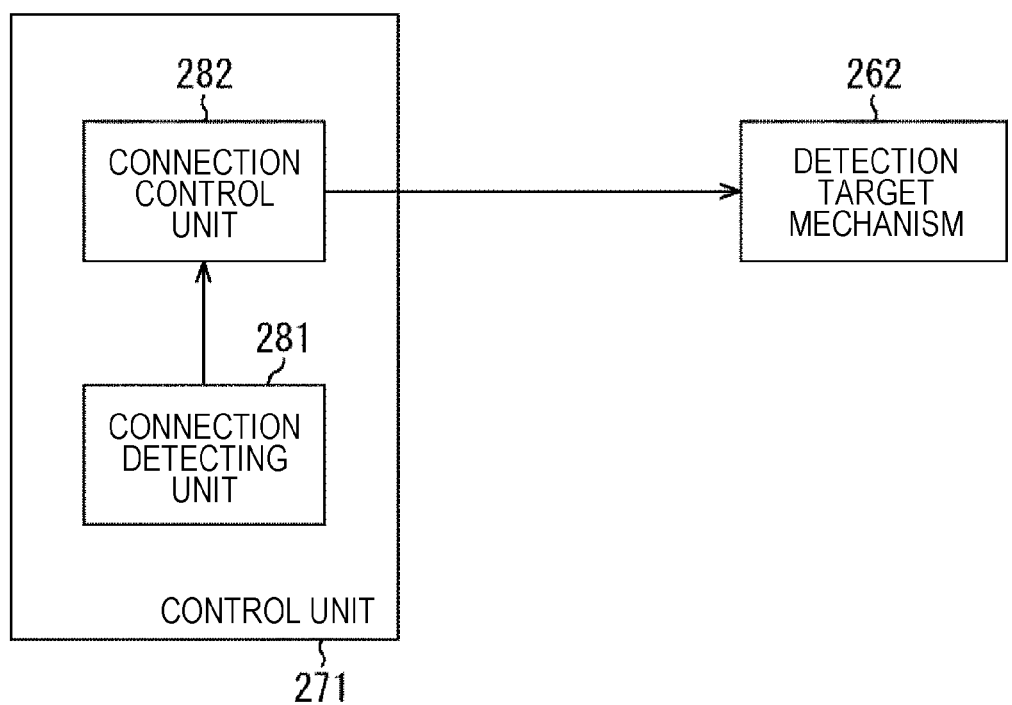
FIG. 13 is a block diagram illustrating an exemplary configuration of a control unit 271.

FIG. 13 is a block diagram illustrating an exemplary configuration of the control unit 271 in FIG. 12.

In FIG. 13, the control unit 271 has a connection detecting unit 281 and a connection control unit 282.

The connection detecting unit 281 detects connection (state) between the USB host 10 and the USB device 20 and supplies the connection control unit 282 with detection information indicating a detected result.

The connection control unit 282 controls connection between the detection target mechanism 262 and the USB host 10 in accordance with the detection information from the connection detecting unit 281.

In other words, in a case where the detection information indicates that the USB host 10 and the USB device 20 are connected, the connection control unit 282 controls the detection target mechanism 262 so as to be connected to the USB host 10.

On the other hand, in a case where the detection information indicates that the USB host 10 and the USB device 20 are not connected, the connection control unit 282 controls the detection target mechanism 262 so as to be disconnected from the USB host 10 (release connection to the USB host 10).

<Exemplary Configurations of Detection Target Mechanism 262 and Connection Detecting Unit 281>

Figure 14:
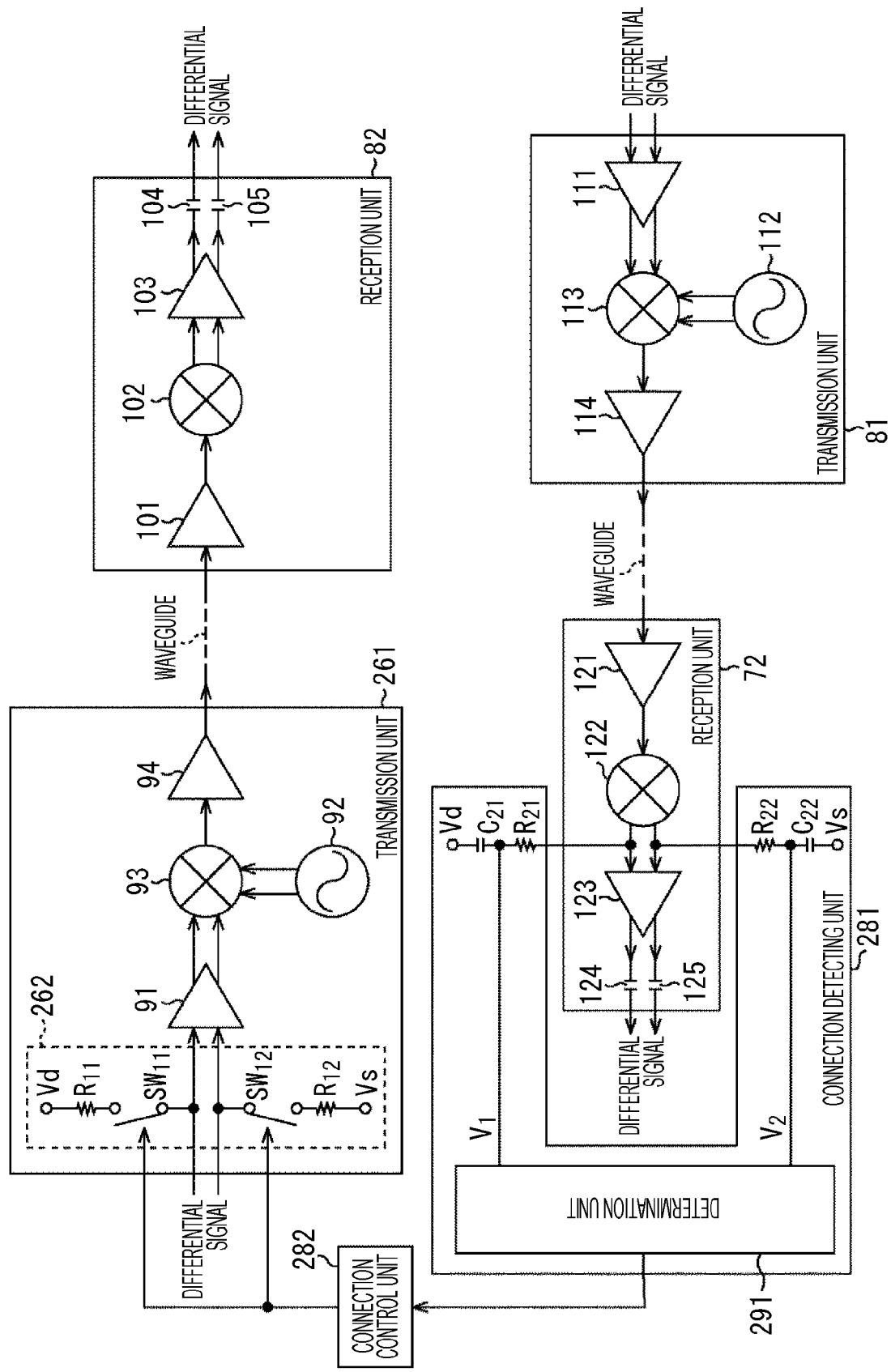
FIG. 14 is a diagram illustrating exemplary configurations of a detection target mechanism 262 and a connection detecting unit 281.

FIG. 14 is a diagram illustrating exemplary configurations of the detection target mechanism 262 and the connection detecting unit 281 in FIG. 13.

Here, as illustrated in FIG. 14, the transmission unit 261 is common with the transmission unit 211 of FIG. 9 in including an amplifier 91, an oscillator 92, a mixer 93, and an amplifier 94.

However, the transmission unit 261 is different from the transmission unit 211 of FIG. 9 in including the detection target mechanism 262 instead of the detection target mechanism 202.

The detection target mechanism 262 is common with the detection target mechanism 202 of FIG. 9 in that: the detection target mechanism is formed of resistors $R_{11}$ and $R_{12}$ serving as common mode impedance; each of the resistors $R_{11}$ and $R_{12}$ has one end connected to an input terminal of the amplifier 91 supplied with differential signals corresponding to baseband signals from the USB host 10; and the resistors $R_{11}$ and $R_{12}$ have the other ends respectively connected to the power sources $V_d$ and $V_s$.

However, the detection target mechanism 262 is different from detection target mechanism 202 of FIG. 9 in that a switch $SW_{11}$ is newly provided between the one end of the resistor $R_{11}$ and an input terminal of the amplifier 91 supplied with a positive signal, and also a switch $SW_{12}$ is newly provided between the one end of the resistor $R_{12}$ and an input signal of the amplifier 91 supplied with a negative signal.

The switches $SW_{11}$ and $SW_{12}$ are turned on or off under the control of the connection unit 282.

In FIG. 14, in a case where the millimeter wave cable 200 (FIG. 6) is connected to the USB host 10, when the switches $SW_{11}$ and $SW_{12}$ are turned on, the USB host 10 and the detection target mechanism 262 are connected, and consequently, the USB host 10 can detect the resistors $R_{11}$ and $R_{12}$ serving as the common mode impedance constituting the detection target mechanism 262.

Furthermore, in FIG. 14, when the switches $SW_{11}$ and $SW_{12}$ are turned off even in a case where the millimeter wave cable 200 (FIG. 6) is connected to the USB host 10, connection between the USB host 10 and the detection target mechanism 262 is disconnected, and therefore, the USB host 10 cannot detect the resistors $R_{11}$ and $R_{12}$ serving as the common mode impedance constituting the detection target mechanism 262.

In a case where detection information from the connection detecting unit 281 indicates that the USB host 10 and the USB device 20 are connected, the connection control unit 282 turns on the switches $SW_{11}$ and $SW_{12}$, and consequently, the USB host 10 and the detection target mechanism 262 are connected, thereby causing the USB host 10 to detect the resistors $R_{11}$ and $R_{12}$ serving as the common mode impedance constituting the detection target mechanism 262.

Furthermore, in a case where the detection information from the connection detecting unit 281 indicates that the USB host 10 and the USB device 20 are not connected, the connection control unit 282 turns off the switches $SW_{11}$ and $SW_{12}$, and consequently, connection between the USB host 10 and the detection target mechanism 262 is disconnected, thereby not causing the USB host 10 to detect the resistors $R_{11}$ and $R_{12}$ serving as the common mode impedance constituting the detection target mechanism 262.

In FIG. 14, the connection detecting unit 281 includes resistors $R_{21}$ and $R_{22}$, capacitors $C_{21}$ and $C_{22}$, and a determination unit 291.

The resistor $R_{21}$ has one end connected to a terminal, out of two terminals to output the differential signals of the mixer 122, to output a positive signal corresponding to one signal of differential signals, and has the other end connected to one end of the capacitor $C_{21}$. The capacitor $C_{21}$ has the other end connected to the power source $V_d$.

The resistor $R_{22}$ has one end connected to a terminal, out of the two terminals to output the differential signals of the mixer 122, to output a negative signal which is the other signal of the differential signals, and has the other end connected to one end of the capacitor $C_{22}$. The capacitor $C_{22}$ has the other end connected to the power source $V_s$.

The determination unit 291 is supplied with voltage $V_1$ at a connection point between the resistor $R_{21}$ and the capacitor $C_{21}$ and also voltage $V_2$ at a connection point between the resistor $R_{22}$ and the capacitor $C_{22}$.

Here, a direct current (DC) offset of the positive signal out of the differential signals appears at the connection point between the resistor $R_{21}$ and the capacitor $C_{21}$, and a DC offset of the negative signal out of the differential signals appears at the connection point between the resistor $R_{22}$ and the capacitor $C_{22}$.

Therefore, the voltage $V_1$ is the DC offset of the positive signal, and the voltage $V_2$ is the DC offset of the negative signal.

The determination unit 291 detects a difference $V_1-V_2$ between the voltage $V_1$ and $V_2$ as power of a modulation signal received in the reception unit 72.

Here, in a case where the USB host 10 and the USB device 20 are not connected via the millimeter wave cables 250 and 60, a modulation signal from the transmission unit 81 on the USB device 20 side cannot be received in the reception unit 72 on the USB host 10 side, and power of the modulation signal received in the reception unit 72 becomes zero (including a value that can be deemed as zero). As a result, the DC offsets of the positive signal and negative signal as the voltage $V_1$ and $V_2$ become (substantially) zero.

On the other hand, in a case where the USB host 10 and the USB device 20 are connected via the millimeter wave cables 250 and 60, a modulation signal transmitted from the transmission unit 81 on the USB device 20 side is received in the reception unit 72 on the USB host 10 side, and the DC offsets of the positive signal and the negative signal as the voltage $V_1$ and $V_2$ become a magnitude corresponding to power of the modulation signal from the transmission unit 81.

The determination unit 291 detects, as the power of the modulation signal received in the reception unit 72, a difference $V_1-V_2$ between the (voltage as) DC offsets $V_1$ and $V_2$ of the positive signal and the negative signal, namely, the differential signals.

Here, for example, assuming that the DC offset $V_1$ of the positive signal is +a (>0), the DC offset $V_2$ of the negative signal ideally becomes −a. In other words, the DC offset $V_1$ of the positive signal and the DC offset $V_2$ of the negative signal ideally become values having the same magnitude with inverted signs.

Therefore, in the determination unit 291, only one of the DC offset $V_1$ of the positive signal and the DC offset $V_2$ of the negative signal can be detected as power of a modulation signal received in the reception unit 72.

However, since the determination unit 291 detects the difference $V_1-V_2$ between the DC offsets $V_1$ and $V_2$ as the power of the modulation signal received in the reception unit 72 as described, sensitivity to detect power of a modulation signal can be more improved than a case of detecting only one of the DC offsets $V_1$ and $V_2$ as power of the modulation signal.

Meanwhile, in FIG. 14, the connection detecting unit 281 detects the power of the modulation signal received in the reception unit 72 by using output of the mixer 122 of the reception unit 72, but additionally the connection detecting unit 281 can detect power of a modulation signal received in the reception unit 72 by using, for example, output of the amplifier 123 and output of the amplifier 121.

As described above, the determination unit 291 detects the difference $V_1-V_2$ between the DC offsets $V_1$ and $V_2$ as the power of the modulation signal received in the reception unit 72, and a connection state between the USB host 10 and the USB device 20 is detected by determining whether the USB host 10 and the USB device 20 are connected on the basis of the power of the modulation signal.

Then, the determination unit 291 supplies the connection control unit 282 with detection information indicating a detected result on the connection state between the USB host 10 and the USB device 20.

Figure 15:
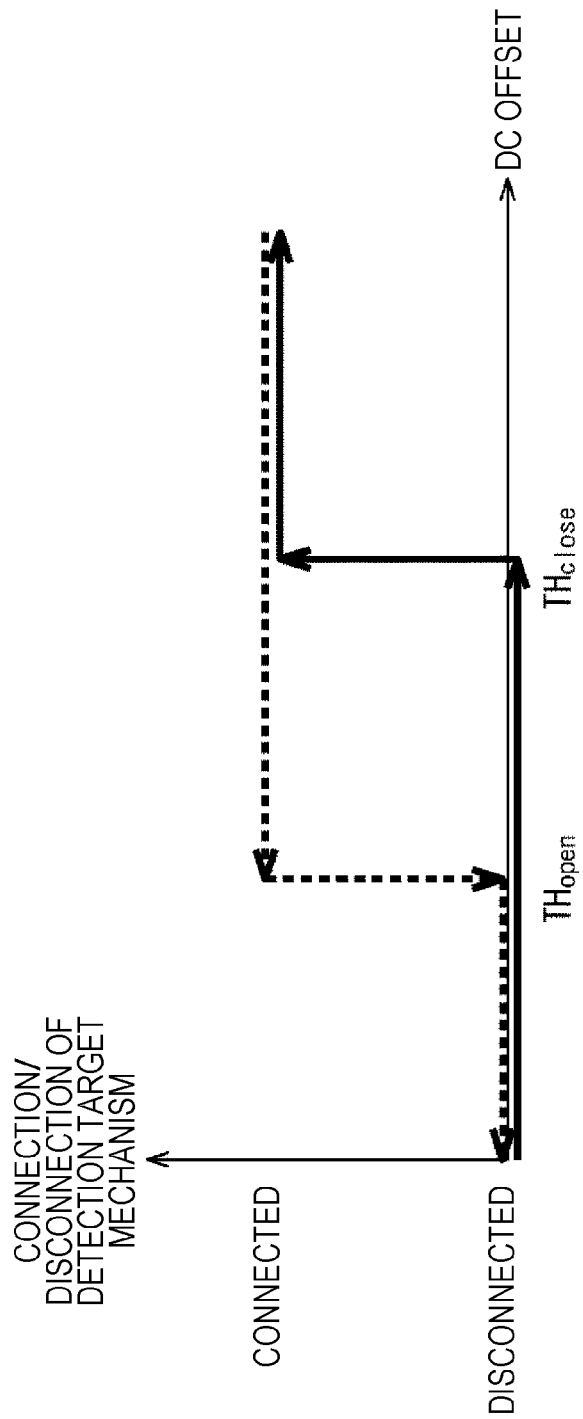
FIG. 15 is a diagram illustrating exemplary processing to detect a connection state between a USB host 10 and a USB device 20 by a determination unit 291.

FIG. 15 is a diagram illustrating exemplary processing to detect a connection state between the USB host 10 and the USB device 20 by the determination unit 291 in FIG. 14.

In a case where power of a modulation signal is predetermined threshold or more (larger) and therefore the millimeter wave connectors 52 and 62 are connected and it is recognized that the modulation signal is transmitted from the USB device 20 to the USB host 10, the determination unit 291 determines (detects) that the USB host 10 and the USB device 20 are connected.

On the other hand, in a case where power of a modulation signal is predetermined threshold or less (smaller) and therefore connection between the millimeter wave connectors 52 and 62 is released, and it is recognized (determined) in the USB host 10 that the modulation signal cannot be received from the USB device 20, the determination unit 291 determines (detects) that the USB host 10 and the USB device 20 are not connected.

Here, note that a first threshold in a case where the determination unit 291 determines that the USB host 10 and the USB device 20 are connected will be also referred to as a connection threshold $TH_{close}$, and also a second threshold in a case of determining that the USB host 10 and the USB device 20 are not connected will be also referred to as a disconnection threshold $TH_{open}$.

Additionally, note that, among detected results on a connection state between the USB host 10 and the USB device 20 in the determination unit 291, a detected result indicating that the USB host 10 and the USB device 20 are connected will be also referred to as a connection detected result, and a detected result indicating that the USB host 10 and the USB device 20 are not connected will be also referred to as a disconnection detected result.

In a case where power of a modulation signal is a value close to the predetermined threshold when the same predetermined threshold values are adopted as the connection threshold value $TH_{close}$ and the disconnection threshold value $TH_{open}$, a connection detected result and a disconnection detected result are frequently switched as a detected result on a connection state between the USB host 10 and the USB device 20, and as a result, connection and disconnection between the USB host 10 and the detection target mechanism 262 may be frequently switched.

Therefore, as illustrated in FIG. 15, values different from each other and satisfying a relation $TH_{close} > TH_{open}$ are adopted as the connection threshold value $TH_{close}$ and the disconnection threshold value $TH_{open}$ and it is possible to provide so-called hysteresis not only for a detected result on the connection state between the USB host 10 and the USB device 20 but also for switching between connection and disconnection between the USB host 10 and the detection target mechanism 262.

In this case, when power of a modulation signal becomes the connection threshold $TH_{close}$ or more, a connection detected result is obtained as a detected result on the connection state between the USB host 10 and the USB device 20, and the detection target mechanism 262 is connected to the USB host 10.

Then, when the detection target mechanism 262 is connected to the USB host 10, even in a case where power of a modulation signal becomes the connection threshold $TH_{close}$ or less, a connection detected result is obtained as a detected result on the connection state between the USB host 10 and the USB device 20, and the detection target mechanism 262 is kept connected to the USB host 10 and not disconnected.

While the detection target mechanism 262 is connected to the USB host 10, in a case where power of a modulation signal becomes the disconnection threshold $TH_{open}$ or less being smaller than the connection threshold $TH_{close}$, a disconnection detected result is obtained as a detected result on the connection state between the USB host 10 and the USB device 20, and the detection target mechanism 262 is disconnected from the USB host 10.

Additionally, when the detection target mechanism 262 is disconnected from the USB host 10, even in a case where power of a modulation signal becomes the disconnection threshold $TH_{open}$ or more, a disconnection detected result is obtained as a detected result on the connection state between the USB host 10 and the USB device 20, and the detection target mechanism 262 is kept disconnected from the USB host 10 and not connected.

When the detection target mechanism 262 is disconnected from the USB host 10, in a case where power of a modulation signal becomes the threshold value $TH_{close}$ or more being higher than the disconnection threshold $TH_{open}$, a connection detected result is obtained as a detected result on the connection state between the USB host 10 and the USB device 20, and the detection target mechanism 262 is connected to the USB host 10.

As described above, since hysteresis is provided in switching between connection and disconnection between the USB host 10 and the detection target mechanism 262, it is possible to prevent frequent occurrence of switching between connection and disconnection between the USB host 10 and the detection target mechanism 262.

Figure 16:
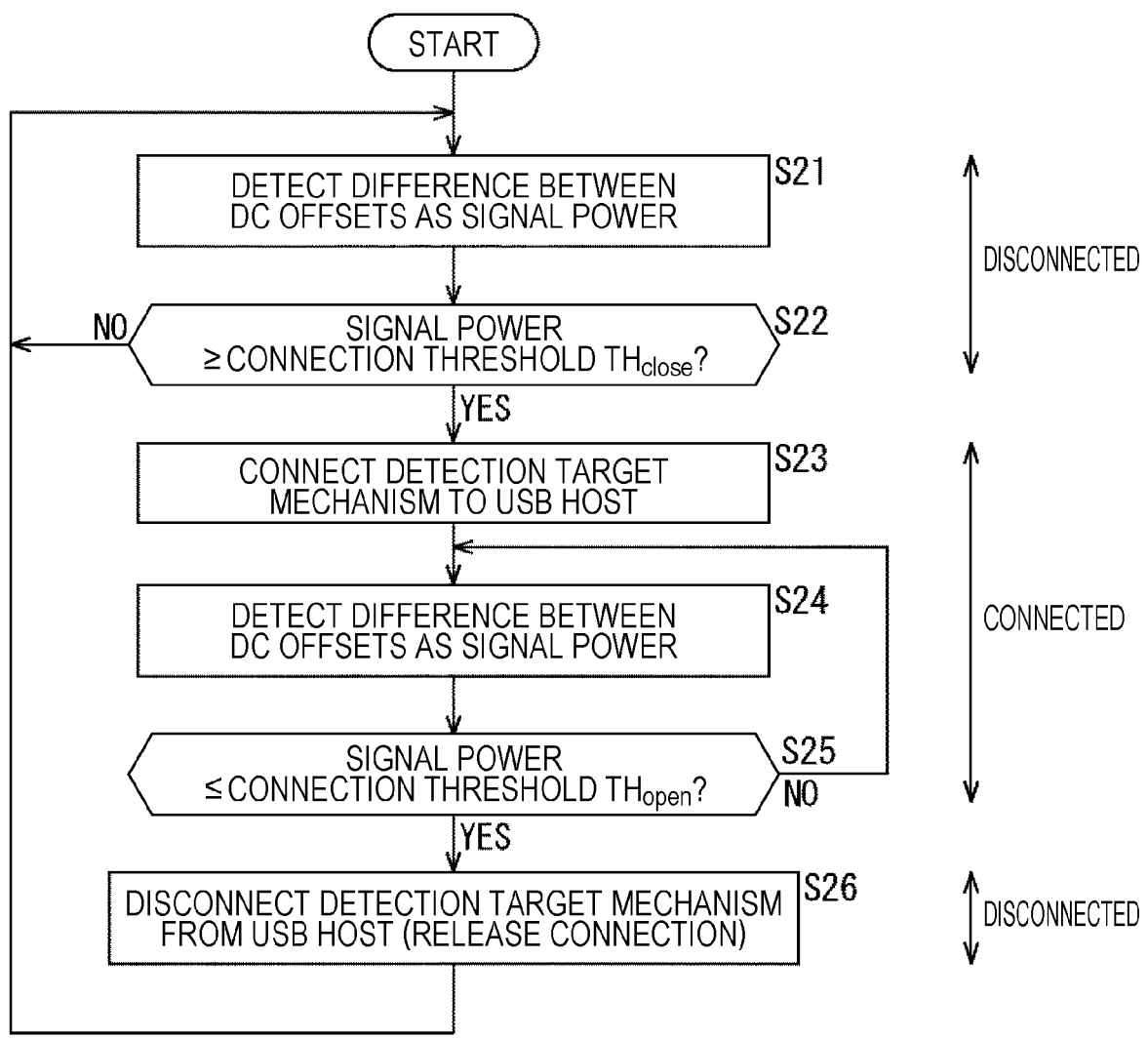
FIG. 16 is a flowchart illustrating exemplary operation of a control unit 271.

FIG. 16 is a flowchart illustrating exemplary operation of the control unit 271 (FIG. 13) in a case where the connection detecting unit 281 is configured as illustrated in FIG. 14.

Note that it is assumed that the detection target mechanism 262 is disconnected from the USB host 10 before starting operation according to the flowchart of FIG. 16.

In step S21, the determination unit 291 of the connection detecting unit 281 detects a difference $V_1-V_2$ between a DC offset $V_1$ of a positive signal of differential signals and a DC offset $V_2$ of a negative signal of the differential signals as power of a modulation signal received in the reception unit 72 and the processing proceeds to step S22. The DC offsets $V_1$ and $V_2$ correspond to baseband signals output from the mixer 122 of the reception unit 72 and obtained by applying frequency conversion to a millimeter wave band modulation signal.

In step S22, the determination unit 291 determines whether power of the modulation signal (hereinafter also referred to as signal power) is a connection threshold $TH_{close}$ or more.

In step S22, in a case of determining that the signal power is not the connection threshold $TH_{close}$ or more, in other words, in a case where the USB host 10 and the USB device 20 are not connected via the millimeter wave cables 250 and 60 and no modulation signal is transmitted from the USB host 10 to the USB device 20, the processing returns to step S21, and the similar processing is repeated thereafter.

Additionally, in step S22, in a case of determining that the signal power is the connection threshold $TH_{close}$ or more, in other words, the USB host 10 and the USB device 20 are connected via the millimeter wave cables 250 and 60 and a modulation signal is transmitted from the USB host 10 to the USB device 20, the determination unit 291 supplies the connection control unit 282 with detection information indicating a connection detected result, and the processing proceeds to step S23.

In step S23, the connection control unit 282 connects the detection target mechanism 262 to the USB host 10 by turning on the switches $SW_{11}$ and $SW_{12}$ (FIG. 14) in accordance with the detection information from the determination unit 291, and the processing proceeds to step S24.

Since the detection target mechanism 262 is connected to the USB host 10, the USB host 10 detects the resistors $R_{11}$ and $R_{12}$ serving as the common mode impedance constituting the detection target mechanism 262. Upon detection of the resistors $R_{11}$ and $R_{12}$ serving as the common mode impedance, the USB host 10 recognizes (detects) connection to the USB device 20 and starts outputting a baseband signal as polling.

Then, when the USB device 20 responds to the polling from the USB host 10, connection is established between the USB host 10 and the USB device 20, and data transmission can be performed.

In step S24, similar to step S21, the determination unit 291 of the connection detecting unit 281 detects power of a modulation signal received in the reception unit 72, and the processing proceeds to step S25.

In step S25, the determination unit 291 determines whether the power (signal power) of the modulation signal is the disconnection threshold $TH_{open}$ or less.

In step S25, in a case of determining that the signal power is not the disconnection threshold $TH_{open}$ or less, in other words, for example, in a case where connection between the millimeter wave connectors 52 and 62 is not released and a modulation signal from the (transmission unit 81 on the) USB device 20 side can be received in the (reception unit 72 on the) USB host 10 side, the processing returns to step S24, and the similar processing is repeated thereafter.

Additionally, in step S25, in a case of determining that the signal power is the disconnection threshold $TH_{open}$ or less, in other words, for example, in a case where connection between the millimeter wave connectors 52 and 62 is released and a modulation signal from the USB device 20 cannot be received in the USB host 10, the determination unit 291 supplies the connection control unit 282 with detection information indicating a disconnection detected result, and the processing proceeds to step S26.

In step S26, the connection control unit 282 disconnects the detection target mechanism 262 from the USB host 10 by turning off the switches $SW_{11}$ and $SW_{12}$ (FIG. 14) in accordance with the detection information from the determination unit 291, the processing returns to step S21, and the similar processing is repeated thereafter.

Since the detection target mechanism 262 is disconnected from the USB host 10, the USB host 10 cannot detect the resistors $R_{11}$ and $R_{12}$ (FIG. 14) serving as the common mode impedance constituting the detection target mechanism 262. Consequently, the USB host 10 recognizes (detects) disconnection from the USB device 20, and stops outputting a baseband signal.

Therefore, it is possible to prevent wasteful power consumption caused by continuously outputting a baseband signal although the USB host 10 is not connected to the USB device 20.

Here, in FIG. 16, in a case where the processing in steps S21, S22, and S26 is performed, the detection target mechanism 262 is brought into a state disconnected from the USB host 10, and in a case where the processing in steps S23 to S25 is performed, the detection target mechanism 262 is brought into a state connected to the USB host 10.

Meanwhile, in the communication system of FIG. 11, it is implicitly assumed that: the transmission unit 81 (FIG. 12) on the USB device 20 side transmits a modulation signal when the USB host 10 and the USB device 20 are connected; and a connection state between the USB host 10 and the USB device 20 is detected in the connection detecting unit 281 (FIG. 13) on the basis of power of the modulation signal, however, a detecting method to detect the connection state between the USB host 10 and the USB device 20 is not limited thereto.

In other words, for example, the millimeter wave connectors 52 and 62 are provided with a mechanical mechanism having different states between when the millimeter wave connectors 52 and 62 are connected and when the connection therebetween is released, and the connection state between the USB host 10 and the USB device 20 can be detected on the basis of a state of the mechanical mechanisms.

In this case, power consumption can be reduced by operating the communication units 251 and 63 (FIG. 12) when the USB host 10 and the USB device 20 are connected and by stopping operation of the communication units 251 and 63 when the USB host 10 and the USB device 20 are not connected.

Another Second Embodiment of Communication System Applying Present Technology

Another exemplary configuration of the second embodiment of the communication system applying the present technology will be described.

In the above-described second embodiment, the description has been given for the example in which the determination unit 291 detects power of a modulation signal received in the reception unit 72, and the connection state between the USB host 10 and the USB device 20 is detected by determining whether the USB host 10 and the USB device 20 are connected on the basis of the power of the modulation signal.

Next, as another exemplary configuration of the second embodiment of the communication system applying the present technology, a case of detecting a connection state between the USB host 10 and the USB device 20 by detecting whether a baseband signal is received in the reception unit 72 will be described.

Since another configuration of the second embodiment of the communication system applying the present technology is similar to that of the communication system in the configuration of the second embodiment illustrated in FIG. 11, the description therefor will be omitted here. Furthermore, since the configuration of the communication unit 251 illustrated in FIG. 12 can be also applied to another configuration of the second embodiment, the description thereof will be omitted.

<Exemplary Configuration of Control Unit 271'>

Figure 17:
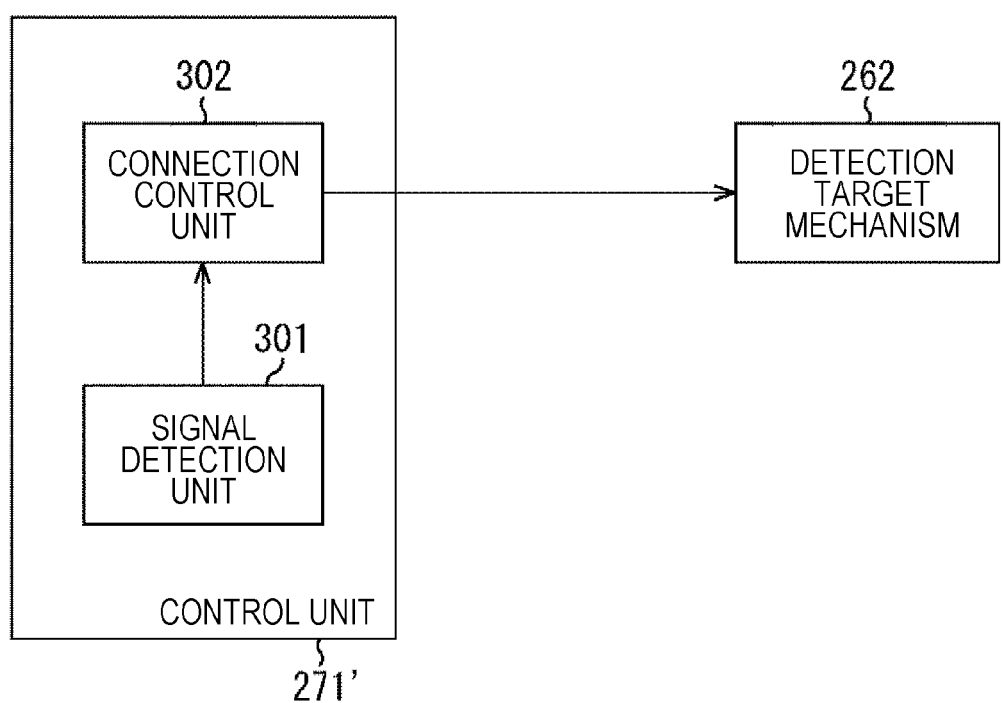
FIG. 17 is a block diagram illustrating an exemplary configuration of a control unit 271'.

FIG. 17 is a block diagram illustrating an exemplary configuration of the control unit 271 in FIG. 12. In the following description, the control unit 271 illustrated in FIG. 17 is attached with a dash and will be described as a control unit 271' in order to be distinguished from the control unit 271 illustrated in FIG. 13.

In FIG. 13, the control unit 271' has a signal detection unit 301 and a connection control unit 302.

The signal detection unit 301 detects connection (state) between the USB host 10 and the USB device 20 and supplies the connection control unit 302 with detection information indicating a detected result. The signal detection unit 301 determines whether the USB host 10 and the USB device 20 is brought into a state capable of transmitting and receiving data by detecting a baseband signal by detecting a baseband signal.

The connection control unit 302 controls connection between the detection target mechanism 262 and the USB host 10 in accordance with the detection information from the signal detection unit 301.

In other words, in a case where the detection information indicates that the USB host 10 and the USB device 20 are connected (communication can be performed), the connection control unit 302 controls the detection target mechanism 262 so as to be connected to the USB host 10.

On the other hand, in a case where the detection information indicates that the USB host 10 and the USB device 20 are not connected (communication cannot be performed), the connection control unit 302 controls the detection target mechanism 262 so as to be disconnected from the USB host 10 (release connection to the USB host 10).

<Exemplary Configurations of Detection Target Mechanism 262 and Signal Detection Unit 301>

Figure 18:
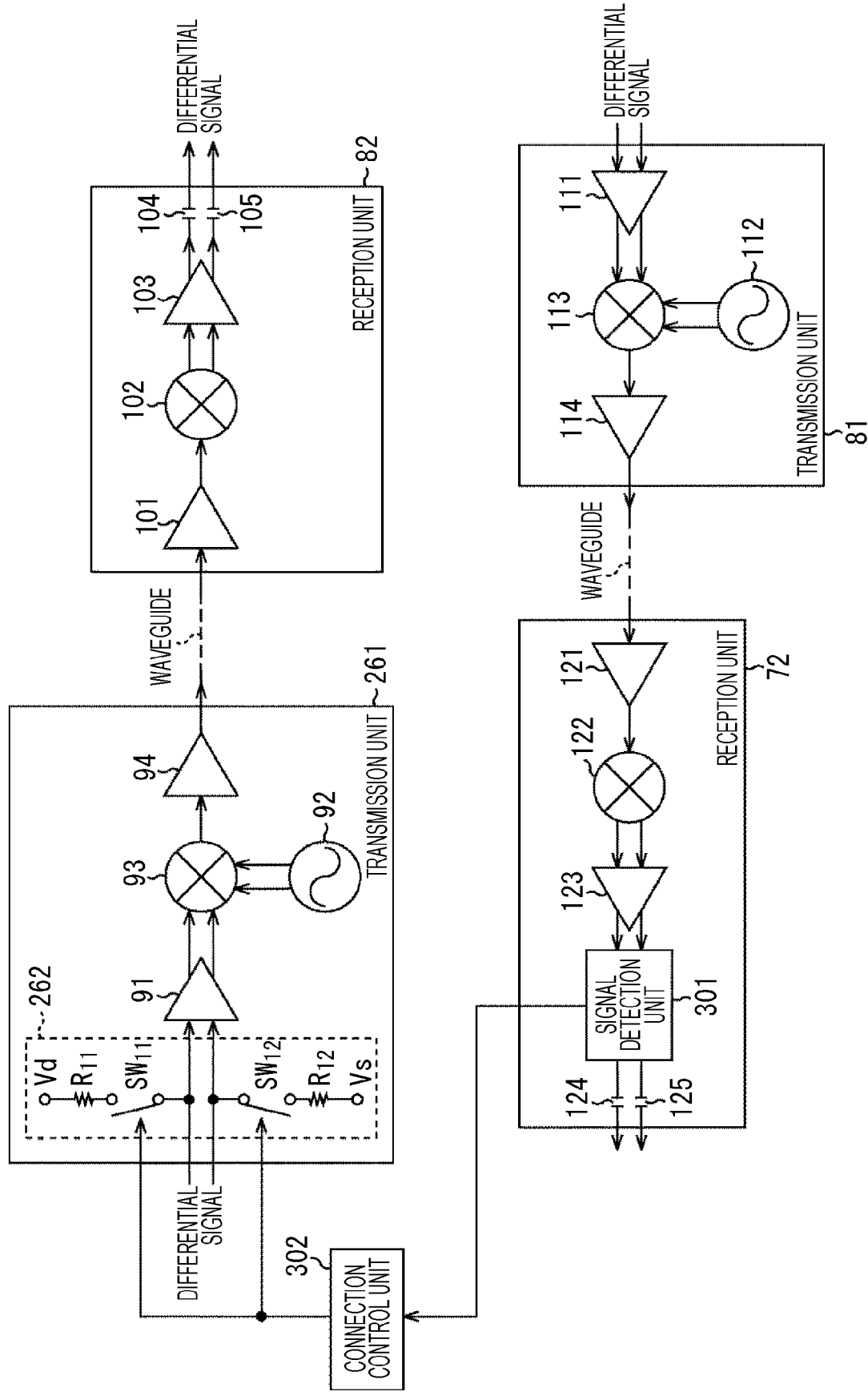
FIG. 18 is a diagram illustrating exemplary configurations of the detection target mechanism 262 and a connection detecting unit 302.

FIG. 18 is a diagram illustrating exemplary configurations of the detection target mechanism 262 and the signal detection unit 301 in FIG. 17.

Here, as illustrated in FIG. 18, the transmission unit 261 has the configuration similar to that of the transmission unit 211 of FIG. 14 in including the amplifier 91, the oscillator 92, the mixer 93, the amplifier 94, and the detection target mechanism 262.

Same as the detection target mechanism 262 illustrated in FIG. 14, the detection target mechanism 262 illustrated in FIG. 18 is also formed of resistors $R_{11}$ and $R_{12}$ serving as common mode impedance, and each of the resistors $R_{11}$ and $R_{12}$ has one end connected to an input terminal of the amplifier 91 supplied with differential signals corresponding to baseband signals from the USB host 10, the resistors $R_{11}$ and $R_{12}$ have the other ends respectively connected to the power sources $V_d$ and $V_s$.

Additionally, the detection target mechanism 262 has a switch $SW_{11}$ provided between one end of the resistor $R_{11}$ and an input terminal of the amplifier 91 supplied with a positive signal, and also has a switch $SW_{12}$ provided between one end of the resistor $R_{12}$ and an input terminal of the amplifier 91 supplied with a negative signal.

The switches $SW_{11}$ and $SW_{12}$ differ from the detection target mechanism 262 illustrated in FIG. 14 in that the switches are turned on or off under the control of the connection control unit 302.

In FIG. 18, when the switches $SW_{11}$ and $SW_{12}$ are turned on in a case where the millimeter wave cable 200 (FIG. 6) is connected to the USB host 10, the USB host 10 and the detection target mechanism 262 are connected, and consequently, the USB host 10 can detect the resistors $R_{11}$ and $R_{12}$ serving as the common mode impedance constituting the detection target mechanism 262.

Furthermore, in FIG. 18, when the switches $SW_{11}$ and $SW_{12}$ are turned off even though the millimeter wave cable 200 (FIG. 6) is connected to the USB host 10, connection between the USB host 10 and the detection target mechanism 262 is disconnected, and therefore, the USB host 10 cannot detect the resistors $R_{11}$ and $R_{12}$ serving as the common mode impedance constituting the detection target mechanism 262.

In a case where detection information from the signal detection unit 301 indicates that the USB host 10 and the USB device 20 are connected in a communicable state, the connection control unit 302 turns on the switches $SW_{11}$ and $SW_{12}$, and consequently, the USB host 10 and the detection target mechanism 262 are connected, thereby causing the USB host 10 to detect the resistors $R_{11}$ and $R_{12}$ serving as the common mode impedance constituting the detection target mechanism 262.

Additionally, in a case where the detection information from the signal detection unit 301 indicates that the USB host 10 and the USB device 20 are not connected in a communicable state, the connection control unit 302 turns off the switches $SW_{11}$ and $SW_{12}$, and consequently, connection between the USB host 10 and the detection target mechanism 262 is disconnected, thereby not causing the USB host 10 to detect the resistors $R_{11}$ and $R_{12}$ serving as the common mode impedance constituting the detection target mechanism 262.

The communicable state is a state in which a baseband signal can be transmitted and received. Starting transmission and reception of a baseband signal is the polling time. As described above, when one of the USB host 10 and the USB device 20 transmit polling and the other one thereof responds to the polling, thereby establishing connection between the USB host 10 and the USB device 20 and achieving data transmission.

The signal detection unit 301 detects that connection is established between the USB host 10 and the USB device 20. When connection is established, the connection control unit 302 turns on the switches $SW_{11}$ and $SW_{12}$, thereby connecting the USB host 10 and the detection target mechanism 262 and causing the USB host 10 to detect the resistors $R_{11}$ and $R_{12}$ serving as the common mode impedance constituting the detection target mechanism 262.

In FIG. 18, the signal detection unit 301 is provided between the amplifier 123 and the capacitor 124 (capacitor 125). In other words, the signal detection unit 301 receives a differential signal output from the amplifier 123, and outputs the differential signal to the capacitor 124 and the capacitor 125.

When a differential signal is received, the signal detection unit 301 determines that a signal is detected, and detects that connection is established between the USB host 10 and the USB device 20.

The signal detection unit 301 supplies the connection control unit 302 with detection information indicating a detected result on connection state between the USB host 10 and the USB device 20.

Figure 19:
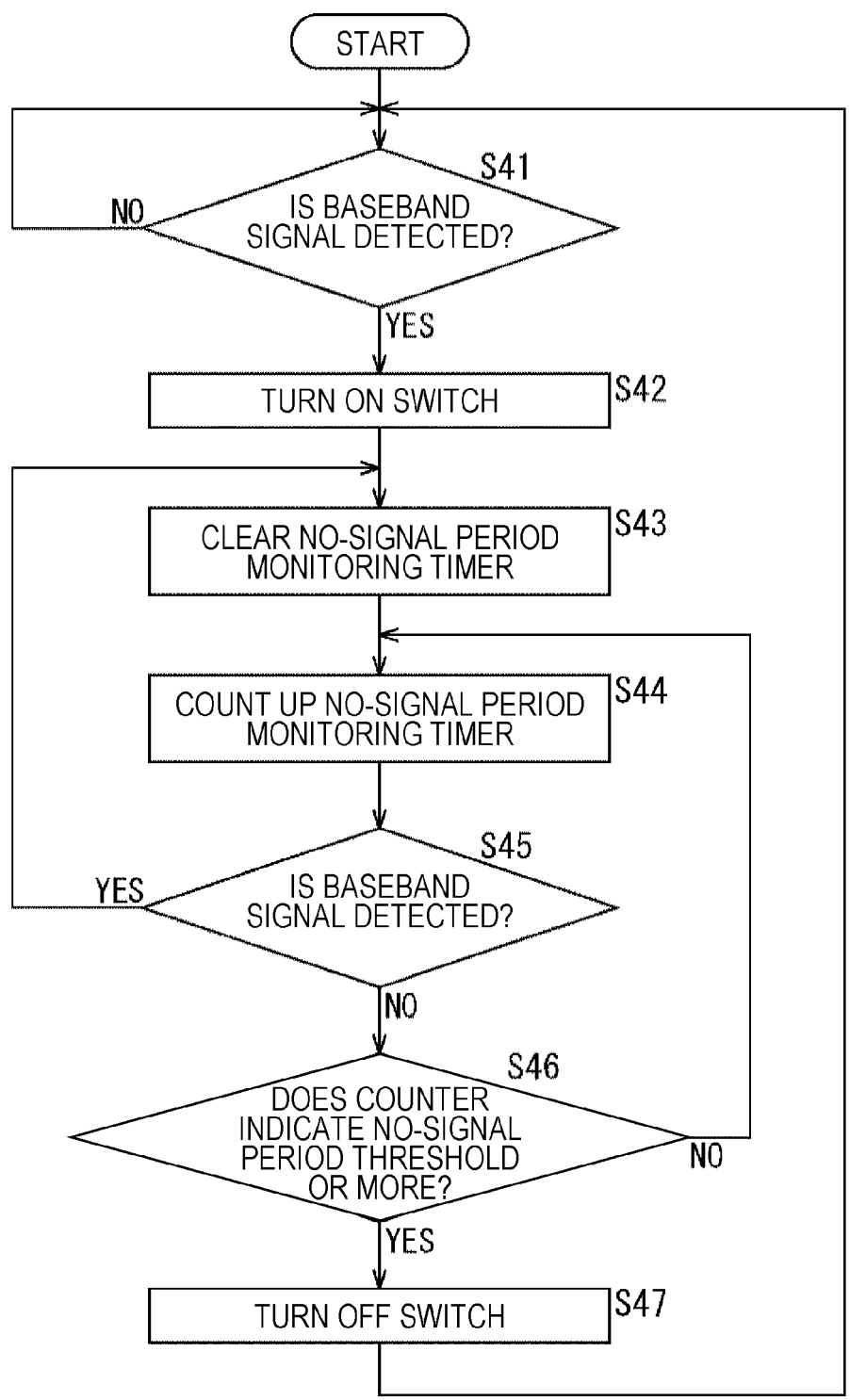
FIG. 19 is a flowchart illustrating exemplary operation of the control unit 271'.

FIG. 19 is a flowchart to describe exemplary processing by the signal detection unit 301 in FIG. 18 to detect a connection state between the USB host 10 and the USB device 20, and exemplary connection processing by the connection control unit 302 based on a detected result.

Note that it is assumed that the detection target mechanism 262 is disconnected from the USB host 10 before starting operation according to the flowchart of FIG. 19. Additionally, the signal detection unit 301 (FIG. 18) of the USB host 10 monitors whether a baseband signal is received.

In step S41, the signal detection unit 301 determines whether a differential signal as a baseband signal is detected, in which the baseband signal is obtained by applying frequency conversion to a millimeter wave band modulation signal output from the amplifier 123 of the reception unit 72. In step S41, the processing of step S41 is repeated until it is determined that a baseband signal is detected, and monitoring related to detection of a baseband signal is continued.

On the other hand, when a baseband signal is detected by the signal detection unit 301 in step S41, the switches $SW_{11}$ and $SW_{12}$ (FIG. 18) are turned on in step S42. In a case where a detected result from the signal detection unit 301 indicates that the baseband signal is detected, the connection control unit 302 connects the detection target mechanism 262 to the USB host 10 by turning on the switches $SW_{11}$ and $SW_{12}$.

In step S43, a timer to monitor a no-signal period (hereinafter referred to as a no-signal period monitoring timer) is cleared. The signal detection unit 301 or the connection control unit 302 includes a no-signal period monitoring timer. Here, a description will be continued assuming that the signal detection unit 301 includes the no-signal period monitoring timer.

The signal detection unit 301 includes the timer (no-signal period monitoring timer) that counts a period during which no differential signal is output from the amplifier 123, in other words, a period during which no baseband signal is detected. In step S43, a count value in the no-signal period monitoring timer is reset to zero.

Meanwhile, in a case where the connection control unit 302 includes the no-signal period monitoring timer, the no-signal period is monitored by using a detected result from the signal detection unit 301.

In step S44, the count value of the no-signal period monitoring timer is counted up. For example, the count value is incremented by 1.

In step S45, whether a baseband signal is detected is determined. In a case where the signal detection unit 301 determines that the baseband signal is detected, the processing returns to step S43 and the no-signal period monitoring timer is cleared.

On the other hand, in a case where the signal detection unit 301 determines that no baseband signal is detected in step S45, the processing proceeds to step S46. In step S46, whether the counter value of the no-signal period monitoring timer is a no-signal period threshold or more is determined.

In step S46, in a case of determining that the counter value of the no-signal period monitoring timer is not the no-signal period threshold or more, the processing returns to step S44 and the no-signal period monitoring timer continues counting.

On the other hand, in a case of determining in step S46 that the counter value of the no-signal period monitoring timer is the no-signal period threshold or more, the processing proceeds to step S47 and the switches $SW_{11}$ and $SW_{12}$ (FIG. 18) are turned off. In a case where the signal detection unit 301 includes the no-signal period monitoring timer, the signal detection unit 301 outputs, to the connection control unit 302, a detected result indicating that a baseband signal is not detected at the time of determining that the counter value is the no-signal period threshold or more.

In a case where a detected result from the signal detection unit 301 indicates that a baseband signal is not detected, the detection target mechanism 262 is disconnected from the USB host 10 by the connection control unit 302 turning off the switches $SW_{11}$ and $SW_{12}$. The processing thereafter is made to return to step S41, and the subsequent processing therefrom is repeated.

Thus, when the no-signal period monitoring timer is provided and the no-signal state continues for a predetermined period, the switches $SW_{11}$ and $SW_{12}$ which has been turned on are controlled to be turned off.

For example, when no-signal period monitoring timer is provided and no baseband signal is detected, the switches $SW_{11}$ and $SW_{12}$ may be frequently turned on and off in a case where control is performed so as to immediately turn off the switches $SW_{11}$ and $SW_{12}$.

Therefore, since the switches $SW_{11}$ and $SW_{12}$ are switched from an on state to an off state when no baseband signal is detected for the predetermined period while providing the no-signal period monitoring timer, it is possible to provide so-called hysteresis for switching between connection and disconnection between the USB host 10 and the detection target mechanism 262.

Thus, connection of the detection target mechanism 262 to the USB host 10 is controlled by detecting a baseband signal, and communication with the USB device 20 is started or finished.

The USB device 20 includes various devices such as a device requiring a short time and a device requiring a long time to output a baseband signal, for example, polling (response to polling) after being connected to the USB host 10. Since the detection target mechanism 262 is connected to the USB host 10 after detecting a baseband signal, communication between the USB host 10 and the USB device 20 can be surely established regardless of a required time in which the USB device 20 becomes a state capable of outputting a baseband signal.

Additionally, since the USB host 10 connects the detection target mechanism 262 after detecting a baseband signal from the USB device 20, and disconnects the detection target mechanism 262 after no longer detecting a baseband signal from the USB device 20, it is possible to prevent wasteful power consumption caused by continuously outputting a baseband signal although the USB host 10 is not connected to the USB device 20.

In other words, while a baseband signal from the USB device 20 is detected, the USB host 10 keeps connection to the detection target mechanism 262, and when a baseband signal from the USB device 20 is stopped because, for example, connection to the USB device 20 is released, output of a baseband signal from the USB host 10 to the USB device 20 is stopped, and therefore, it is possible to prevent wasteful power consumption caused by continuously outputting a baseband signal.

Third Embodiment of Communication System Applying Present Technology

Figure 20:
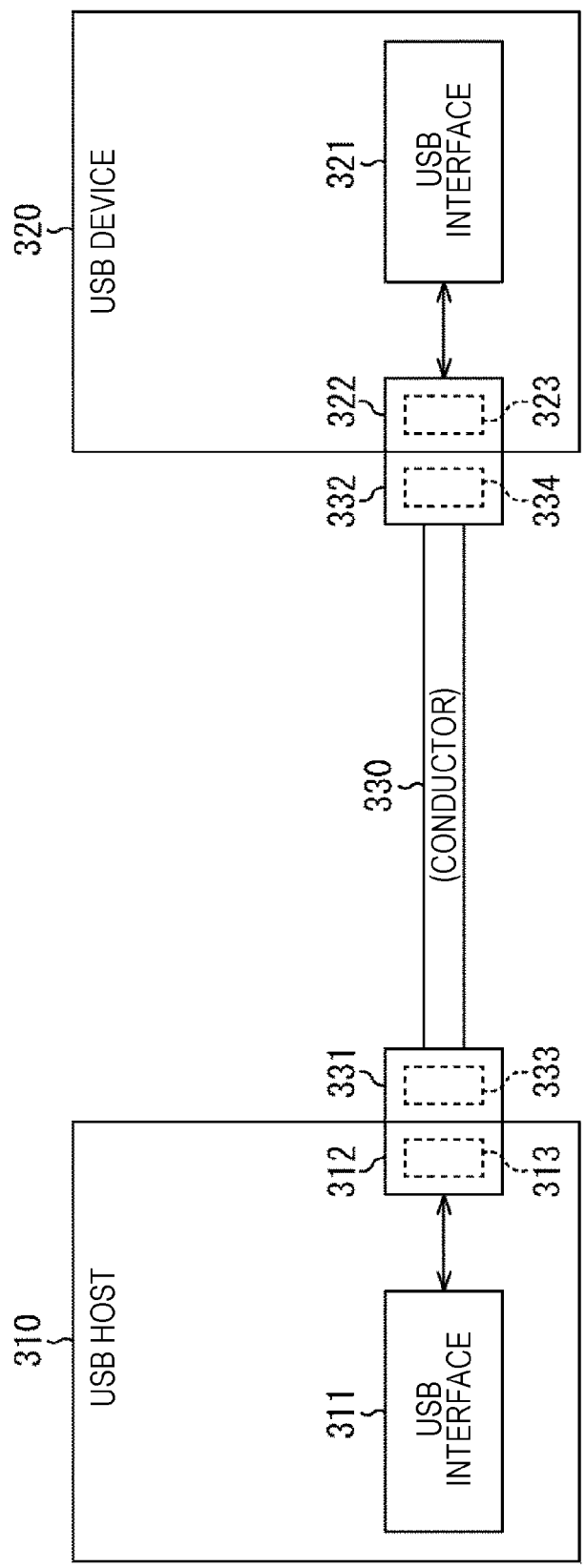
FIG. 20 is a diagram illustrating an exemplary configuration of a third embodiment of a communication system applying the present technology.

FIG. 20 is a diagram illustrating an exemplary configuration according to a third embodiment of a communication system applying the present technology.

In the communication system of FIG. 20, a USB host 310 and a USB device 320 are connected by a millimeter-wave-ready electric cable 330.

The USB host 310 is an electronic apparatus having a function to serve as a USB host similar to the USB host 10, and includes a USB interface 311 and a millimeter wave connector 312.

The USB interface 311 is an interface to control data transmission by a USB, and is connected to (a communication unit 313 incorporated in) the millimeter wave connector 312.

Similar to the millimeter wave connectors 52 and 62 (FIGS. 6 and 11), the millimeter wave connector 312 is formed of a material such as a dielectric material serving as a waveguide adapted to transmit a millimeter wave band modulation signal, and incorporates the communication unit 313.

The communication unit 313 has a configuration similar to that of the communication unit 201 (FIG. 6) and the communication unit 251 (FIG. 11), and performs transmission and reception of a baseband signal with the USB interface 311 and also performs transmission and reception of a millimeter wave band modulation signal with a communication unit 333 via millimeter wave connectors 312 and 331 serving as the waveguides.

The USB device 320 is an electronic apparatus having a function to serve as a USB device similar to the USB device 20, and includes a USB interface 321 and a millimeter wave connector 322.

The USB interface 321 is an interface to control data transmission by the USB, and is connected to (a communication unit 323 incorporated in) the millimeter wave connector 322.

Similar to the millimeter wave connectors 52 and 62 (FIGS. 6 and 11), the millimeter wave connector 312 is formed of a material such as a dielectric material serving as a waveguide adapted to transmit a millimeter wave band modulation signal, and incorporates the communication unit 323.

The communication unit 323 has a configuration similar to that of, for example, the communication unit 63 (FIGS. 6 and 11), and performs transmission and reception of a baseband signal with the USB interface 321 and also performs transmission and reception of a millimeter wave band modulation signal with a communication unit 334 via millimeter wave connectors 322 and 332 serving as the waveguides.

The millimeter-wave-ready electric cable 330 is a cable having a core wire formed of a conductor, in which: the millimeter wave connector 331 to be fitted to the millimeter wave connector 312 of the USB host 310 is provided at one end; and the millimeter wave connector 332 to be fitted with the millimeter wave connector 322 of the USB device 320 is provided at the other end.

Similar to the millimeter wave connectors 52 and 62 (FIGS. 6 and 11), the millimeter wave connectors 331 and 332 are each formed of a material such as a dielectric material serving as a waveguide adapted to transmit a millimeter wave band modulation signal. Additionally, the millimeter wave connector 331 incorporates the communication unit 333, and the millimeter wave connector 332 incorporates the communication unit 334.

The communication unit 333 has a configuration similar to that of, for example, the communication unit 63 (FIGS. 6 and 11), and performs transmission and reception of a millimeter wave band modulation signal with the communication unit 313 via the millimeter wave connectors 331 and 312 serving as the waveguides, and also performs transmission and reception of a baseband signal with the communication unit 334 via the conductor serving as the core wire of the millimeter-wave-ready electric cable 330.

The communication unit 334 has a configuration similar to that of, for example, a communication unit 53 (FIG. 3) and performs transmission and reception of a millimeter wave band modulation signal with the communication unit 323 via the millimeter wave connectors 332 and 322 serving as the waveguides, and also performs transmission and reception of a baseband signal with the communication unit 333 via the conductor serving as the core wire of the millimeter-wave-ready electric cable 330.

In FIG. 20, the USB host 310 and the USB device 320 are connected via the millimeter-wave-ready electric cable 330 by connecting the millimeter wave connector 331 of the millimeter-wave-ready electric cable 330 to the millimeter wave connector 312 of the USB host 310 and also connecting the millimeter wave connector 332 of the millimeter-wave-ready electric cable 330 to the millimeter wave connector 322 of the USB device 320.

Additionally, data transmission by a baseband signal is performed between the USB interface 311 of the USB host 310 and the USB interface 321 of the USB device 320 by performing exchange of a modulation signal between the communication units 313 and 333, exchange of a baseband signal between the communication units 333 and 334, and exchange of a modulation signal between the communication units 334 and 323.

In FIG. 20, the millimeter wave connectors 312, 322, 331, and 332 can be each formed of a non-metal in a manner similar to the millimeter wave connectors 52 and 62, and in this case, it is easier to handle water proofing and dust proofing compared to a connector formed of a metal, and it is not necessary to consider deterioration of a contact point caused by insertion/removal, and furthermore, freedom of design can be increased.

Here, in the communication systems of FIGS. 6 and 11, it is necessary to connect the USB host 10 and the USB device 20 by two millimeter wave cables 200 (or 250) and 60 in order to perform data transmission between the USB host 10 and the USB device 20.

However, in the communication systems of FIGS. 6 and 11, it is unnecessary to provide the USB host 10 and the USB device 20 with the millimeter wave connectors such as the millimeter wave connectors 312 and 322 like the case in FIG. 20.

On the other hand, in the communication system of FIG. 20, it is necessary to provide the USB host 310 with the millimeter wave connector 312 and also provide the USB device 320 with the millimeter wave connector 322.

However, in the communication system of FIG. 20, the USB host 310 and the USB device 320 can be connected by one millimeter-wave-ready electric cable 330 in order to perform data transmission between the USB host 310 and the USB device 320.

Furthermore, in the communication system of FIG. 20, a merit such as easy dust proofing and water proofing can be obtained at both a connecting portion between the USB host 310 and the millimeter-wave-ready electric cable 330 and a connecting portion between the USB device 320 and the millimeter-wave-ready electric cable 330.

Fourth Embodiment of Communication System Applying Present Technology

Figure 21:
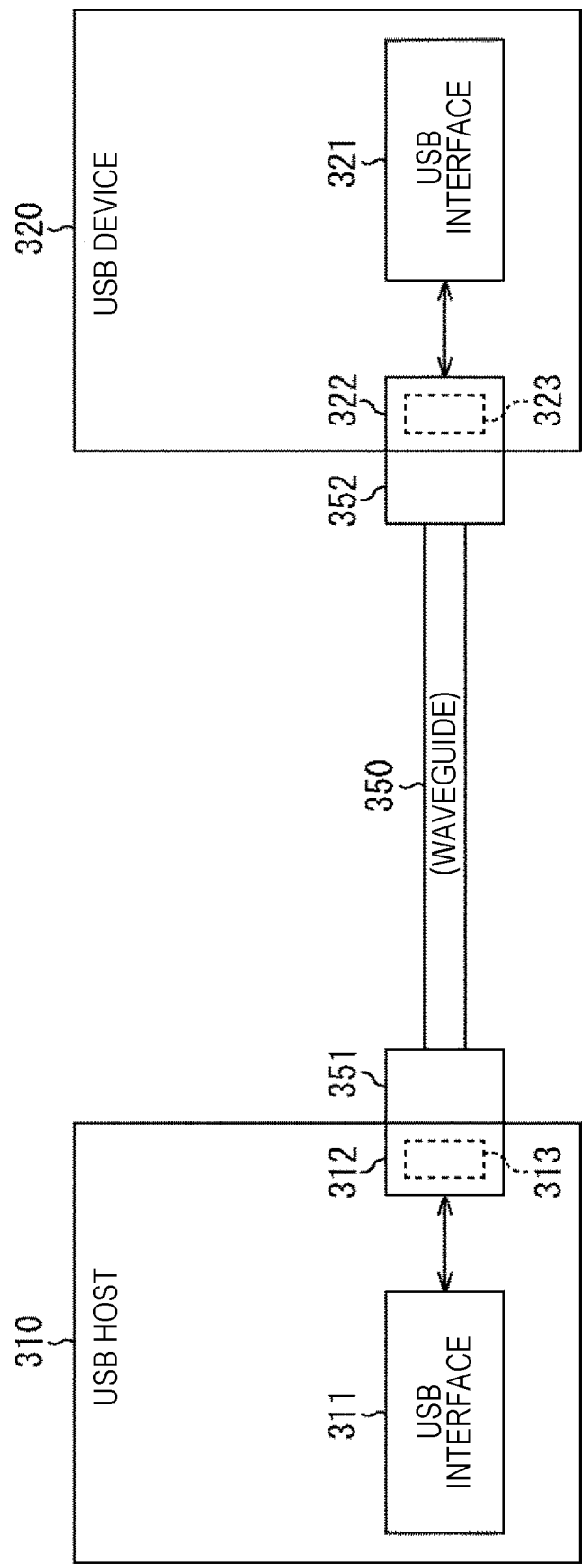
FIG. 21 is a diagram illustrating an exemplary configuration of a fourth embodiment of a communication system applying the present technology.

FIG. 21 is a diagram illustrating an exemplary configuration according to a fourth embodiment of a communication system applying the present technology.

Note that, in the drawing, a component corresponding to a component in a case of FIG. 20 is denoted by a same reference sign, and a description therefor will be suitably omitted in the following.

The communication system of FIG. 21 is common with the case of FIG. 20 in including a USB host 310 and a USB device 320, but is different from the case of FIG. 20 in that a millimeter wave transmission cable 350 is provided instead of the millimeter-wave-ready electric cable 330.

The millimeter wave transmission cable 350 is a cable in which a waveguide to transmit a millimeter wave band modulation signal serves as a core wire, and a millimeter wave connector 351 to be fitted to a millimeter wave connector 312 of the USB host 310 is provided at one end and a millimeter wave connector 352 to be fitted to a millimeter wave connector 322 of the USB device 320 is provided at the other end.

Similar to millimeter wave connectors 52 and 62 (FIGS. 6 and 11), the millimeter wave connectors 351 and 352 are each formed of a material such as a dielectric material serving as a waveguide adapted to transmit a millimeter wave band modulation signal.

Therefore, the entire millimeter wave transmission cable 350 (from the millimeter wave connectors 351 to 352) serves as the waveguide adapted to transmit a millimeter wave band modulation signal.

In FIG. 21, the USB host 310 and the USB device 320 are connected via the millimeter wave transmission cable 350 by connecting the millimeter wave connector 351 of the millimeter wave transmission cable 350 to the millimeter wave connector 312 of the USB host 310 and also connecting the millimeter wave connector 352 of the millimeter wave transmission cable 350 to the millimeter wave connector 322 of the USB device 320.

Additionally, data transmission by a baseband signal is performed between a USB interface 311 of the USB host 310 and a USB interface 321 of the USB device 320 by exchanging a millimeter wave band modulation signal between communication units 313 and 323 via the millimeter wave transmission cable 350 serving as the waveguide.

In the communication system of FIG. 21 also, effects similar to those in the case of FIG. 20 can be obtained.

Fifth Embodiment of Communication System Applying Present Technology

Figure 22:
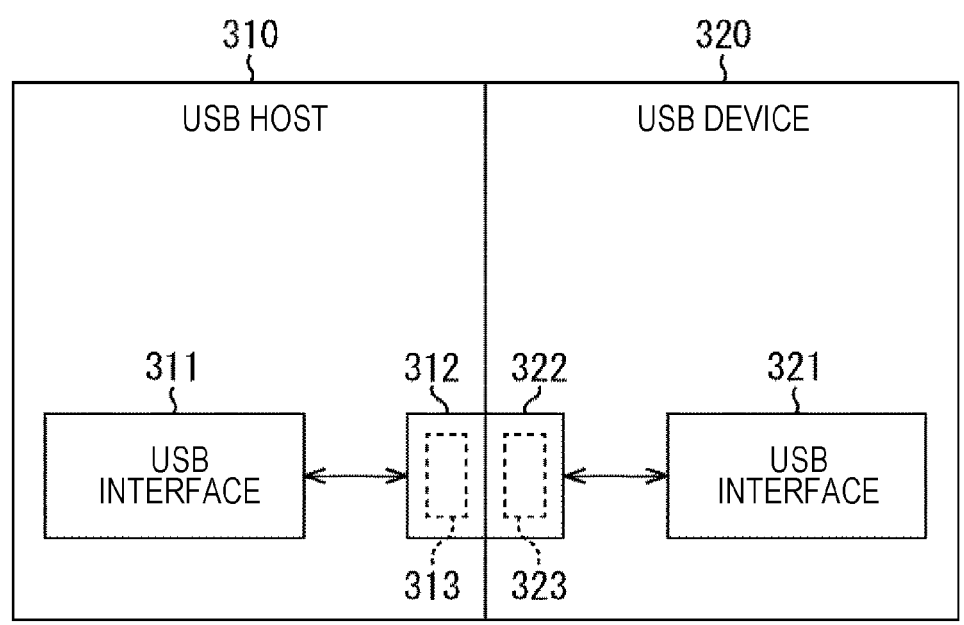
FIG. 22 is a diagram illustrating an exemplary configuration of a fifth embodiment of a communication system applying the present technology.

FIG. 22 is a diagram illustrating an exemplary configuration according to a fifth embodiment of a communication system applying the present technology.

Note that, in the drawing, a component corresponding to a component in a case of FIG. 20 is denoted by a same reference sign, and a description therefor will be suitably omitted in the following.

The communication system of FIG. 22 is common with the case of FIG. 20 in including a USB host 310 and a USB device 320, but is different from the case of FIG. 20 in that the millimeter-wave-ready electric cable 330 is not provided.

A millimeter wave connector 312 of the USB host 310 and a millimeter wave connector 322 of the USB device 320 are respectively fitted to millimeter wave connectors 331 and 332 of the millimeter-wave-ready electric cable 330 (or millimeter wave connectors 351 and 352 of a millimeter wave transmission cable 350), and furthermore can be directly fitted to each other.

In FIG. 22, for example, the millimeter wave connector 312 of the USB host 310 and the millimeter wave connector 322 of the USB device 320 are directly connected like a case where a USB memory serving as a USB device is directly connected to a personal computer (PC) serving as a USB host.

Additionally, data transmission by a baseband signal is performed between a USB interface 311 of the USB host 310 and a USB interface 321 of the USB device 320 by performing exchange of a millimeter wave band modulation signal between a communication unit 313 included in the millimeter wave connector 312 and a communication unit 323 included in the millimeter wave connector 322 via the millimeter wave connectors 312 and 322 serving as the waveguide.

In the communication system of FIG. 22 also, effects similar as those in the case of FIG. 20 can be obtained.

Meanwhile, the embodiments of the present technology are not limited to the above-described embodiments, and various kinds of modifications can be made within a range without departing from a gist of the present technology.

For example, in the present embodiments, a millimeter wave band signal is adopted as a modulation signal, but a signal in a frequency band lower or higher than the millimeter wave can be adopted as the modulation signal.

Furthermore, in the present embodiment, the case where the present technology is applied to (a communication system formed of) an electronic apparatus compliant with the USB standard has been described, but the present technology can be applied not only to an electronic apparatus compliant with a USB apparatus but also to an electronic apparatus or the like adopting a system to detect a communication partner (connection to a communication partner) by using a detection target mechanism included in the communication partner, such as an electronic apparatus including a PCI Express as an interface.

Furthermore, in the communication system of FIG. 6, the communication unit 201 is incorporated in the millimeter wave connector 52, but the communication unit 201 can be incorporated in an arbitrary position of the millimeter wave cable 200 under the condition that a waveguide to transmit a modulation signal is formed on the way to the communication unit 62. The communication unit 62 can also be incorporated in an arbitrary position of the millimeter wave cable 60 other than the millimeter wave connector 62 under the condition that a waveguide is formed on the way to the communication unit 201. The similar is applied to the communication system of FIG. 11.

Here, in the present specification, the system means an assembly including a plurality of constituent elements (devices, modules (parts), and the like), and whether all of the constituent elements are located in a same housing is disregarded. Therefore, both a plurality of devices housed in different housings and connected via a network and a device having a plurality of modules housed in a single housing are the system.

Additionally, note that the effects described in the present specification are only examples and not limited thereto, and additional effects may be provided as well.

Meanwhile, the present technology can also have following configurations.

(1)

A communication device including:

a detection target mechanism detected by a first electronic apparatus when the first electronic apparatus is connected to a second electronic apparatus that receives a baseband signal output from the first electronic apparatus, and corresponding to a mechanism incorporated in the second electronic apparatus, the detection target mechanism being adapted to be connected to the first electronic apparatus;

a connection detecting unit adapted to detect a baseband signal output from the second electronic apparatus, and adapted to detect connection between the first electronic apparatus and the second electronic apparatus; and a control unit adapted to connect the detection target mechanism to the first electronic apparatus in a case where connection between the first electronic apparatus and the second electronic apparatus is detected by the connection detecting unit.

(2)

The communication device recited in (1) above, in which the control unit disconnects the detection target mechanism from the first electronic apparatus in a case where the baseband signal is not detected by the connection detecting unit for a predetermined period.

(3)

The communication device recited in (1) or (2) above, in which the detection target mechanism is formed of common mode impedance.

(4)

The communication device recited in any one of (1) to (3) above, further including a transmission unit adapted to transmit a millimeter wave band signal obtained by applying frequency conversion to a baseband signal output from the first electronic apparatus into a signal having a frequency band higher than the baseband signal does.

(5)

A control method for a communication device including a detection target mechanism detected by a first electronic apparatus when the first electronic apparatus is connected to a second electronic apparatus that receives a baseband signal output from the first electronic apparatus, and corresponding to a mechanism incorporated in the second electronic apparatus, the detection target mechanism being adapted to be connected to the first electronic apparatus, the method including:

detecting a baseband signal output from the second electronic apparatus, and detecting connection between the first electronic apparatus and the second electronic apparatus; and connecting the detection target mechanism to the first electronic apparatus in a case where connection between the first electronic apparatus and the second electronic apparatus is detected.

REFERENCE SIGNS LIST

10 USB host
11 USB connector
20 USB device
21 USB connector
22 Detection target mechanism
30 USB cable
31, 32 USB connector
50 Millimeter wave cable
51 USB connector
52 Millimeter wave connector
53 Communication unit
60 Millimeter wave cable
61 USB connector
62 Millimeter wave connector
63 Communication unit
71 Transmission unit
72 Reception unit
81 Transmission unit
82 Reception unit
91 Amplifier
92 Oscillator
93 Mixer
94, 101 Amplifier
102 Mixer
103 Amplifier
104, 105 Capacitor
111 Amplifier
112 Oscillator
113 Mixer
114, 121 Amplifier
122 Mixer
123 Amplifier
124, 125 Capacitor
200 Millimeter wave cable
201 Communication unit
202 Detection target mechanism
211 Transmission unit
250 Millimeter wave cable
251 Communication unit
261 Transmission unit
262 Detection target mechanism
271 Control unit
281 Connection detecting unit
282 Connection control unit
291 Determination unit
301 Signal detection unit
302 Connection control unit
310 USB host
311 USB interface
312 Millimeter wave connector
313 Communication unit
320 USB device
321 USB interface
322 Millimeter wave connector
323 Millimeter wave connector
330 Millimeter-wave-ready electric cable
331, 332 Millimeter wave connector
333, 334 Communication unit
350 Millimeter wave transmission cable
351, 352 Millimeter wave connector

What is claimed is:

1. A communication device comprising:

a detection target mechanism detected by a first electronic apparatus when the first electronic apparatus is connected to a second electronic apparatus that receives a first baseband signal output from the first electronic apparatus, wherein the detection target mechanism corresponds to a mechanism incorporated in the second electronic apparatus, wherein the detection target mechanism is configured to be connected to the first electronic apparatus;

a connection detecting unit configured to:
detect a second baseband signal output from the second electronic apparatus, and
detect a connection between the first electronic apparatus and the second electronic apparatus; and a control unit configured to:
determine the connection detecting unit has detected the connection between the first electronic apparatus and the second electronic apparatus,
connect the detection target mechanism to the first electronic apparatus in response to determining the connection detecting unit has detected the connection between the first electronic apparatus and the second electronic apparatus,
after connecting the detection target mechanism to the first electronic apparatus, determine the connection detecting unit has not detected the second baseband signal output from the second electronic apparatus, and disconnect the detection target mechanism from the first electronic apparatus in response to determining the connection detecting unit has not detected the second baseband signal output from the second electronic apparatus.

2. The communication device according to claim 1, wherein the control unit is further configured to reconnect the detection target mechanism to the first electronic apparatus a predetermined period of time after disconnecting the detection target mechanism from the first electronic apparatus.

3. The communication device according to claim 1, wherein the detection target mechanism is formed of common mode impedance.

4. The communication device according to claim 1, further comprising a transmission unit configured to transmit a millimeter wave band signal, wherein the millimeter wave band is obtained by applying frequency conversion to the first baseband signal, wherein the first baseband signal is of a first frequency, wherein the millimeter wave band signal has is of a second frequency higher than the first frequency.

5. A control method for a communication device including a detection target mechanism detected by a first electronic apparatus when the first electronic apparatus is connected to a second electronic apparatus that receives a first baseband signal output from the first electronic apparatus, and corresponding to a mechanism incorporated in the second electronic apparatus, wherein the detection target mechanism is configured to be connected to the first electronic apparatus, the method comprising:

detecting, with a connection detecting unit, a second baseband signal output from the second electronic apparatus;

detecting, with the connection detecting unit, a connection between the first electronic apparatus and the second electronic apparatus;

determining, with a control unit, the connection detecting unit has detected the connection between the first electronic apparatus and the second electronic apparatus;

connecting, with the control unit, the detection target mechanism to the first electronic apparatus in response to determining the connection detecting unit has detected the connection between the first electronic apparatus and the second electronic apparatus;

after connecting the detection target mechanism to the first electronic apparatus, determining the connection detecting unit has not detected the second baseband signal output from the second electronic apparatus; and disconnecting the detection target mechanism from the first electronic apparatus in response to determining the connection detecting unit has not detected the second baseband signal output from the second electronic apparatus.

\* \* \* \* \*